(12) United States Patent
Martin

(10) Patent No.: US 9,239,343 B2
(45) Date of Patent: Jan. 19, 2016

(54) INTERLEAVED DIGITAL DOWN-CONVERSION ON A TEST AND MEASUREMENT INSTRUMENT

(75) Inventor: Gregory A. Martin, Portland, OR (US)

(73) Assignee: TEKTRONIX, INC., Beaverton, OR (US)

(*) Notice: Subject to any disclaimer, the term of this patent is extended or adjusted under 35 U.S.C. 154(b) by 1020 days.

(21) Appl. No.: 13/270,752

(22) Filed: Oct. 11, 2011

(65) Prior Publication Data

US 2012/0310601 A1 Dec. 6, 2012

Related U.S. Application Data

(60) Provisional application No. 61/493,831, filed on Jun. 6, 2011.

(51) Int. Cl.
| | | |
|---|---|---|
| *G06F 3/01* | (2006.01) | |
| *G01R 7/00* | (2006.01) | |
| *G01R 7/02* | (2006.01) | |
| *G06F 3/00* | (2006.01) | |
| *G01R 19/25* | (2006.01) | |
| *G01R 13/02* | (2006.01) | |

(52) U.S. Cl.
CPC ........ *G01R 19/2506* (2013.01); *G01R 13/0272* (2013.01)

(58) Field of Classification Search
CPC .................................................. G01R 13/0272

USPC ................. 341/67, 68, 75, 76, 117, 187, 190; 375/120; 702/339
See application file for complete search history.

(56) References Cited

U.S. PATENT DOCUMENTS

| | | | | |
|---|---|---|---|---|
| 6,232,897 | B1 * | 5/2001 | Knusen | 341/120 |
| 6,339,390 | B1 * | 1/2002 | Velazquez et al. | 341/120 |
| 6,615,148 | B2 * | 9/2003 | Pickerd | 702/66 |
| 8,233,569 | B2 * | 7/2012 | Tan et al. | 375/339 |
| 8,452,571 | B2 * | 5/2013 | Turpin | 702/187 |

* cited by examiner

*Primary Examiner* — John Breene
*Assistant Examiner* — Felix Suarez
(74) *Attorney, Agent, or Firm* — Thomas F. Lenihan; Marger Johnson

(57) ABSTRACT

A digital down-conversion acquisition function, includes a key spectral analysis function, in time-interleaved acquisition systems to enable acquisitions at very high sample rates and bandwidths. Digital down-conversion allows data compression into acquisition memory for down-converted complex baseband I/Q data within a given frequency range of interest. With a fixed-size acquisition memory, this enables acquisitions over a longer time span, thus enabling a lower spectral resolution bandwidth. These approaches allow down-converted complex baseband I/Q data from a narrow frequency band of interest to be acquired efficiently. Reconstruction of the acquired down-converted waveform from the time-interleaved components stored in each acquisition memory of each distributed acquisition components to result in a coherent waveform is also disclosed.

25 Claims, 16 Drawing Sheets

INTERLEAVED DIGITAL DOWN-CONVERSION ON A TEST AND MEASUREMENT INSTRUMENT

RELATED APPLICATION DATA

This application claims the benefit of U.S. Provisional Application No. 61/493,831, filed on Jun. 6, 2011, which is hereby incorporated by reference.

BACKGROUND

This disclosure relates to test and measurement instruments and related devices, and in particular, to a distributed time-interleaved acquisition digital down-conversion method and system.

Traditionally, test and measurement instruments such as spectrum analyzers and vector analyzers have had minimal triggering capabilities and/or limited real-time bandwidth. Mixed-Domain Oscilloscopes (MDOs) represent a new product category of test and measurement devices, which integrate many of the spectral acquisition, triggering, and display capabilities of Real-Time Spectrum Analyzer (RTSA) products with the functionality of traditional oscilloscope products, in addition to supporting a wide range of acquisition span bandwidths, up to very wide real-time bandwidths supported by time-interleaved acquisition systems. In addition to supporting time domain features of traditional oscilloscopes and frequency domain features of RTSAs, the MDO products enable cross-correlation between both domains for acquisition, triggering, display, and analysis functions.

In such newer types of products, the RF input signal is digitally down-converted to produce I (in-phase) and Q (quadrature) baseband component information from the RF signal. More specifically, the RF signal is numerically multiplied with a sine and cosine, thereby generating the I and Q component information, which contains all of the information present in the original RF signal (within the span of interest). The acquisition data can then be further decimated if the desired span of interest is less than the maximum bandwidth in the system. Thus, this allows a longer period of time to be acquired into acquisition memory for cases where there are narrower spans of interest, given the constraint of a fixed acquisition memory size. Supporting a longer acquisition time span, in turn, allows a narrower resolution bandwidth for spectral analysis modes.

In conventional oscilloscopes and digitizers, time-interleaved acquisition is an approach for building test and measurement device acquisition systems with scalable sample rate and bandwidth and to extend acquisition systems beyond the capabilities of individual analog to digital converter (ADC) and/or digitizer components. For example, FIG. 1 shows a conventional example of a time-interleaved acquisition system used in oscilloscopes. A high-bandwidth sampler such as a track and hold component 105 is used to distribute sampled versions of the input signal 130 to multiple ADCs 110 with appropriate offsets in sampling time, based on the aggregate sample rate of the acquisition system and the total number of interleaved ADC and/or digitizer components.

A digitizer component such as component 115 is then used to process the incoming samples and store them in acquisition memory 120. The digitizer component 115 is a type of building block for acquisition, triggering, display, and analysis in an oscilloscope device. There is usually some form of interconnect between the different digitizer components for combining the time-interleaved acquisition data samples for further processing and analysis, which results in a coherent waveform 125 at the full sample rate of the acquisition system.

Prior approaches to supporting mixed-domain functionality primarily target single-digitizer component systems, which limits the sample rate and real-time bandwidth that can be acquired. To support a greater frequency range in an RF acquisition system traditionally has required expensive RF oscillator and mixer components to down-convert the input signal in the analog domain prior to the ADC component. This type of system is still limited to the bandwidth of a single ADC, in terms of the bandwidth span that can be acquired in real-time.

It would be desirable to have an acquisition technique that distributes digital down-conversion (DDC) functionality among multiple distributed time-interleaved acquisition components. It would also be desirable to support acquisitions over longer time spans, thereby enabling a lower spectral resolution bandwidth. In addition, it would be desirable to efficiently acquire spectral data from a narrower frequency band of interest anywhere within the aggregate bandwidth of the time-interleaved system and to support the reconstruction of acquired down-converted waveform data from the time-interleaved digitizer components stored in memory associated with each distributed acquisition component.

DETAILED DESCRIPTION

Figure 1:
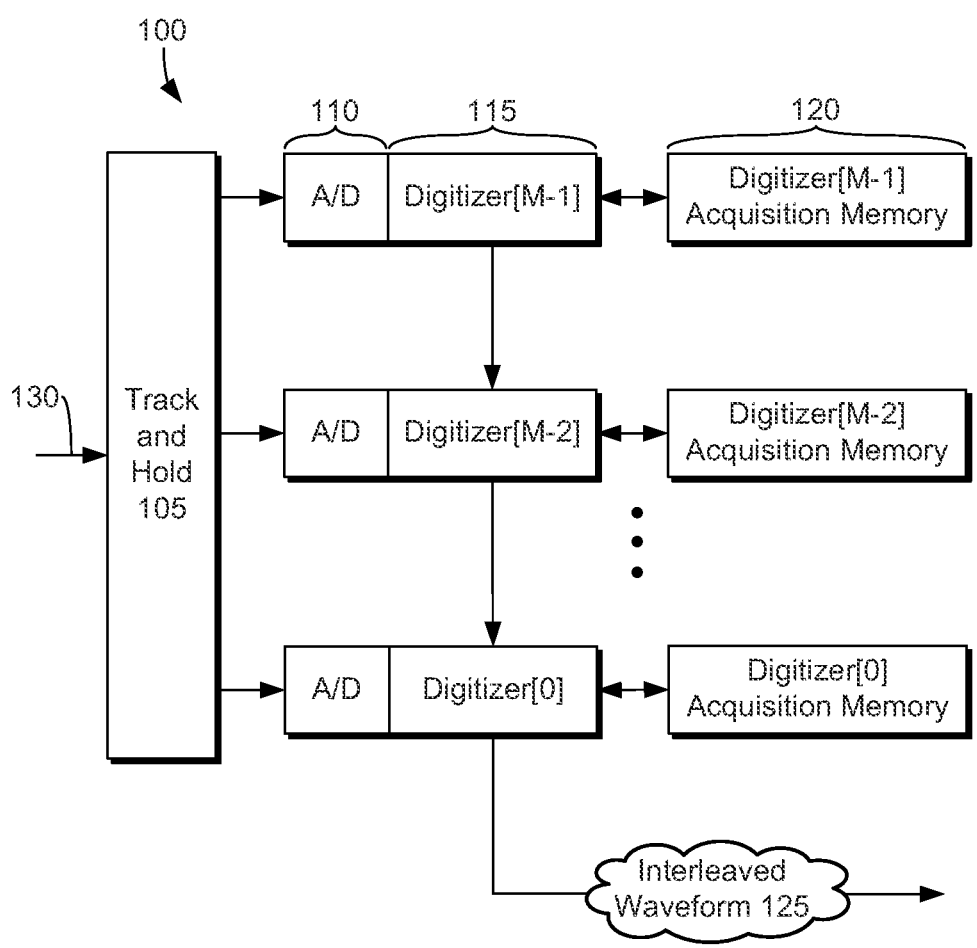
FIG. 1 illustrates a conventional time-interleaved acquisition system used in an oscilloscope.

Embodiments of the invention disclosed herein provide a means for distributed digital down-conversion (DDC) functionality among multiple distributed time-interleaved acquisition components of a test and measurement instrument, thereby enabling acquisitions at very high sample rates and bandwidths.

Digital down-conversion allows data compression into acquisition memory for spectral data within a given frequency range of interest (e.g., any arbitrary bandwidth span within the combined bandwidth of the time-interleaved system). With a fixed-size acquisition memory, this enables acquisitions over a longer time span, thereby enabling a lower spectral resolution bandwidth. These techniques allow spectral data from a narrow frequency band of interest anywhere within the aggregate bandwidth of the interleaved system to be acquired efficiently. Moreover, the embodiments described herein set forth the process of reconstructing the acquired down-converted waveform from the time-interleaved components stored in memory associated with each distributed acquisition component.

The inventive concepts disclosed herein can be implemented within a variety of test and measurement instruments such as a spectrum analyzer, an oscilloscope, a vector analyzer, a mixed-domain oscilloscope (MDO), or any other suitable test and measurement device. The inventive concepts disclosed herein can also be applied for applications other than test and measurement instruments. Disclosed herein are systems and processes for distributing the digital down-conversion (DDC) acquisition function between multiple distributed time-interleaved acquisition components to allow the DDC to occur in real-time. Moreover, a coherent waveform can be reconstructed from the acquired data samples from each of the distributed acquisition components using the processes disclosed herein to support further processing.

Digital down-conversion functionality is a fundamental building block for spectral analysis features such as RF triggering, frequency domain waveform processing and display, and RF time domain waveform processing and display. Conceptually, digital-down conversion can involve three steps:

Mixing the input waveform with a complex numerically-controlled oscillator (NCO) waveform to shift the desired center frequency of the acquisition down to DC. That is, the desired frequency span of interest can be centered at DC prior to low-pass filtering and decimation.

Low-pass filtering to reduce the total bandwidth to the desired frequency span of interest.

Down-sampling to decimate the filtered data samples to an appropriate sample rate based on the desired frequency span of interest and the response of low-pass filter used in the second step, thereby reducing or preventing aliasing. The second and third steps can be combined as multiple stages alternating between filtering and down-sampling to reduce the span of interest down to the desired span in multiple stages.

In MDO and RTSA instruments, there are two primary classes of applications that use down-converted acquisition data: spectral Digital Phosphor technology, or DPX®, as used in display and/or processing using spectral data in the frequency domain, and RF time-domain display and/or processing using complex down-converted (i.e. demodulated) samples in the time domain. Embodiments of the invention can be applied to other general RF time and frequency domain acquisition and analysis applications as well. Embodiments of the present invention enable interleaved DDC processes. For example, such interleaved DDC processes are integrated with the classes of applications and processing functions mentioned above, as these processing functions can be integrated with the interleaved DDC process so that the acquisition data is recombined from multiple distributed acquisition components in a time-interleaved acquisition system, thereby resulting in coherent, reconstructed waveforms, which can be used for further processing in the system.

Figure 2:
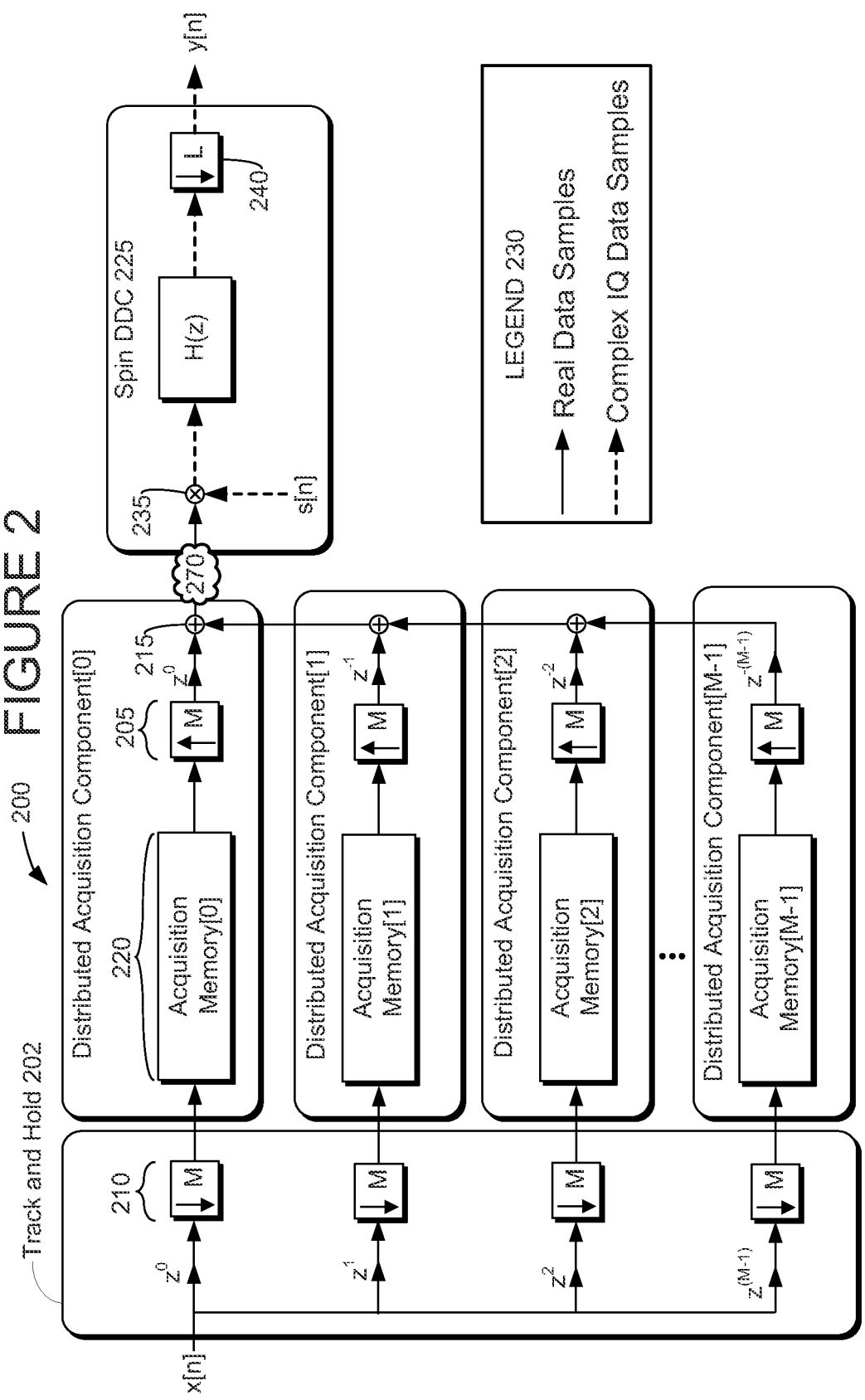
FIG. 2 illustrates a flow diagram including various components of a time-interleaved digital down-conversion system according to an example embodiment of the present invention.

FIG. 2 illustrates a flow diagram including various components of a time-interleaved digital down-conversion system 200 according to an example embodiment of the present invention. System 200 implements the DDC process as a time-interleaved acquisition system. In this embodiment, a single DDC section 225 is at the end of the time-interleaved acquisition component chain or processing network (e.g., an interconnected ring or other suitable interleaved network of distributed acquisition components: [0], [1], [2], . . . , [M−1]). It will be understood that the terms "acquisition component" or "acquisition components" as used herein, generally refer to one or more of the distributed acquisition components [0], [1], [2], . . . , [M−1] described and illustrated herein. All of the data is de-interleaved and becomes contiguous in time in the recombination process. That is, the data is de-interleaved between all distributed acquisition components and the DDC process occurs after de-interleaving the data in the last distributed acquisition component (i.e., [0]) in the interleaved chain. The samples between distributed acquisition components can be de-interleaved by an up-sampling by the total number of distributed acquisition components, M, taking into account the relative time-interleave sampling phase offsets, as noted by the $z^{-n}$ delay stages (to denote a n-sample delay) present in the figures following the up-sampler section 205, followed by a trivial summation operation 215 in each distributed acquisition component. As a result, the DDC section 225 is coupled to the summer 215 of the last acquisition component (i.e., [0]) and operates on a summed coherent waveform 270. Other interconnect topologies to de-interleaving the distributed acquisition data can be used as well, including star and mesh network topologies, and yield the same resulting coherent waveform 270.

Alternatively, the DDC operation can be pushed earlier in the distributed processing chain (e.g., ahead of de-interleaving in the post-processing data path that occurs after data is stored into acquisition memory and into the real-time acquisition data path ahead of storing data into acquisition memory), which further enhances system functionality and performance, and which is further described in detail below.

As shown in FIG. 2, acquisition data is interleaved across M distributed acquisition components: [0], [1], [2], . . . , [M−1]. Each of the M distributed acquisition components [0], [1], [2], . . . , [M−1] can receive time-interleaved digital samples from multiple analog-to-digital converters (ADCs) (not shown), which receive sampled data from a high-bandwidth sampler such as a track and hold component 202. While the input waveform x[n] (effectively sampled at the aggregate sample rate of the time-interleaved acquisition system) is shown as being directly received by the distributed acquisition components, it will be understood that other circuit components such as the ADCs and high-bandwidth sampler can be disposed along the input pathway for receiving the input waveform x[n] and effectively decimating it with the associated time-interleave sampling time offset to match the sample rate supported by each of the distributed acquisition components.

Thus, the input waveform x[n] is divided into constituent sub-sampled phases (e.g., $z^0$, $z^1$, $z^2$, $z^{(M-1)}$), which can be processed simultaneously (i.e., in parallel) among multiple distributed acquisition components. Implicit down-sampling and resulting sampling phase offsets for each of the downstream distributed acquisition components in the track and hold component are represented by the relative sample delays (e.g., $z^0$, $z^1$, $z^2$, $z^{(M-1)}$) shown with each of the parallel paths of x[n] followed by down-samplers 210. Each distributed acquisition component has associated therewith acquisition memory (e.g., 220) for storing the digital samples associated with that acquisition component. Each distributed acquisition component also includes one or more up-samplers (e.g., 205) followed by delay stages that compensate for the relative phase offsets that correspond to the relative time-interleaved sampling offset and summers (e.g., 215) for de-interleaving the data samples between the M distributed acquisition components, thereby producing the summed coherent waveform 270. In some embodiments, the up-sampling is performed by a factor of M, as illustrated by 205. The up-sampler 205 is coupled to an output of the acquisition memory 220.

By convention, as shown in legend 230, the solid line arrows represent real data samples and/or data paths, and the broken line arrows represent complex I/Q data samples and/or data paths. This convention also applies to the following figures, even though the legend is not displayed in every figure.

The DDC section 225 performs the digital down-conversion process and includes a numerically-controlled oscillator (NCO) to shift the desired and/or selected center frequency of the acquired span of interest to DC. Mixer and/or multiplier 235 can multiply the waveform 270 by a complex NCO sinusoidal waveform, which can be given by:

$$s[n] = e^{\frac{-j2\pi f_c n}{f_s}} = \cos\left(\frac{2\pi f_c n}{f_s}\right) - j \cdot \sin\left(\frac{2\pi f_c n}{f_s}\right),$$

where $f_c$ is the desired and/or selected center frequency of the acquisition span of interest, $f_s$ is the effective aggregate sample rate of the acquisition system, n is the integer discrete-time sample index, and j is the imaginary unit to signify a complex number notation. The NCO waveform is defined by a complex waveform having mathematical real and imaginary parts.

The complex sinusoidal s[n] represents the NCO and mixing process that performs a shift of the spectral data in the frequency domain to move the center frequency of the frequency span of interest to be centered at DC. Thus, the mixer component 235 produces a frequency-shifted output signal based on the coherent waveform 270 (after de-interleaving acquisition data from all of the distributed acquisition components) and the complex sinusoidal waveform s[n]. One or more low-pass filters in the DDC section 225, H(z), is coupled to the mixer component 235. The filter 225 receives and filters the mixed signal produced by mixer 235. A down-sampler 240 is coupled to the filter 225 and down-samples the frequency-shifted and low-pass filtered signal. The filter in the DDC section 225, H(z), and down-sampler 240, can represent the effective combination of multiple low-pass decimating filter stages in the DDC block. The down-sampler 240 can include one or more down-samplers interspersed between one or more decimating filters or filter stages. L is the inherent down-sampling factor (i.e., aggregate combination of the total down-sampling present in the DDC 225 stage) as a desired and/or selected sample rate reduction factor for a given bandwidth span relative to the aggregate input sample rate of the interleaved acquisition system. The filter, H(z), receives the frequency-shifted signal from the mixer and/or multiplier 235, and together with the down-sampler 240, produces coherent down-converted baseband I/Q data samples as output signal y[n].

The down-sample factor L can include the inherent down-sample by two in the process of converting real data samples to down-converted complex I/Q data samples. Only half of the original sample rate is needed to represent the equivalent spectral data with complex I/Q data samples relative to the original acquired real data samples. This is because the real waveform is conjugate-symmetric in the frequency domain and the mirrored half can be removed by shifting the center frequency and low-pass filtering when converting the data to a complex sample representation.

As mentioned above, the DDC section 225 can follow the last distributed acquisition component in the interleaved processing chain. The DDC section 225 can receive the recombined coherent waveform 270 from the one or more summers 215 of the last distributed acquisition component (i.e., time-interleaved sampling phase [0]), and output the output waveform y[n], which represents the coherent down-converted I/Q data. Other interconnect topologies, such as star and mesh topologies, can also be used to de-interleave and combine acquisition data samples from all distributed acquisition components to yield the same resulting coherent waveform. The coherent down-converted complex I/Q baseband data can be made available to support downstream analysis and processing functions (not shown).

In this embodiment, data is acquired at full sample rate into each acquisition component's memory. Furthermore, post-processing operations, such as spectral and RF time domain waveform processing, analysis, and display functions, occur in the last distributed acquisition component (i.e., time-interleave sampling phase [0]), or in an external field-programmable gate array (FPGA), external processor, and/or other suitable external circuit, after the data is unloaded or streamed directly from the last acquisition component.

This embodiment is particularly useful for wide bandwidth spans that are near or at the full bandwidth of the instrument, where only real data samples at full sample rate (i.e. no decimation possible prior to storing real-time acquisition data to memory) can feasibly be acquired into the acquisition memory due to the sample rate necessary for the data given the span bandwidth, filtering considerations at high bandwidth spans (and related circuit size and/or area required to support such filtering in real-time), data size required to store data samples, memory bandwidth requirements, or the like. This embodiment can provide the lowest inter-component communication bandwidth requirements when low decimation factors are used. For example, only 8-bit real samples need to be exchanged between the distributed acquisition components instead of larger complex I/Q data samples. When the DDC section 225 is operated at full acquisition sample rate output (i.e., no additional decimation due to span reduction), there need only be decimation by two in the DDC process (to convert the real acquisition data samples into complex I/Q data samples as described above).

Figure 3:
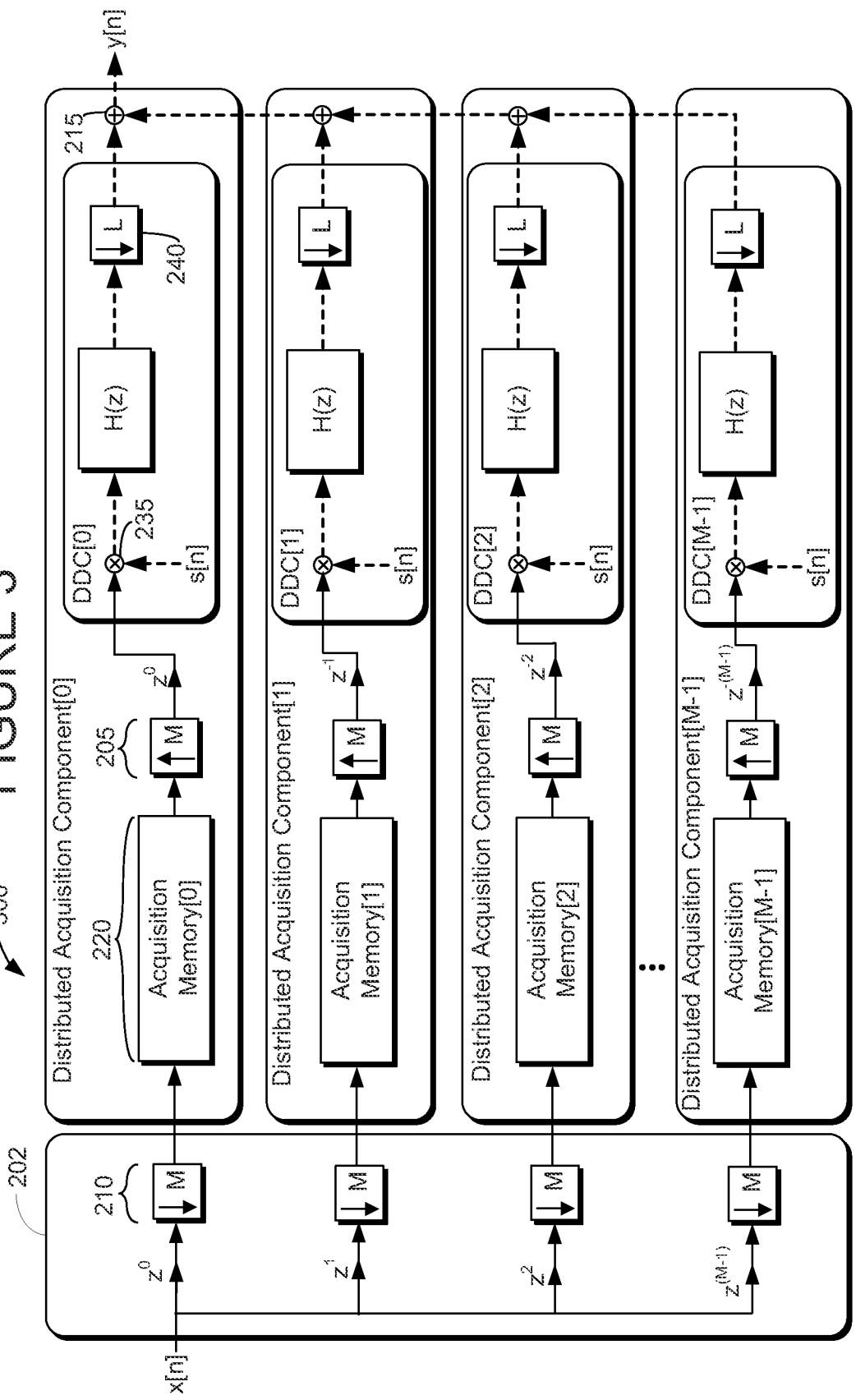
FIG. 3 illustrates a flow diagram including various components of a time-interleaved digital down-conversion system according to another example embodiment of the present invention.

FIG. 3 illustrates a flow diagram including various components of a time-interleaved digital down-conversion system 300 according to another example embodiment of the present invention. Some of the aspects and/or components of FIG. 3 are discussed above with reference to FIG. 2, and therefore for the sake of brevity, a detailed description of these is not repeated.

In this embodiment, the digital down-conversion process occurs prior to the de-interleave process. Each of the distributed acquisition components [0], [1], [2], ..., [M–1] (time-interleaved sampling phases) has associated therewith a corresponding DDC section [0], [1], [2], ..., [M–1], respectively. In this manner, the DDC operation is distributed into each acquisition component instead of being entirely contained in the last acquisition component. In other words, rather than performing the DDC operation after the de-interleave process has been completed, the DDC operation is performed ahead of recombining the data samples into a coherent waveform through summation between distributed acquisition components. Up-sampling by the interleave factor of M is performed by up-sampler 205 followed by a delay stage to compensate for the relative sampling phase offsets in each of the distributed acquisition components prior to the corresponding DDC section. Each DDC section includes a mixer component 235, which receives and multiplies the portion of the digitized samples that are stored in the corresponding acquisition memory 220 with the complex sinusoidal waveform s[n] (after up-sampling by M). Each DDC section produces down-converted I/Q data. One or more summers 215 of each of the distributed acquisition components are coupled to an output of each corresponding DDC section. The one or more summers are configured to de-interleave the down-converted I/Q data received from the DDC sections across all distributed acquisition components, yielding the coherent waveform result, y[n].

In this embodiment, complex I/Q data samples are transferred and de-interleaved between the distributed acquisition components. Thus, when real data samples at full sample rate need to be stored into the acquisition memory based on selected system settings (e.g., such as at very wide bandwidth spans), it is preferable to use a different example embodiment disclosed herein, such as that set forth above with reference to FIG. 2, as this reduces the interconnect bandwidth required for the de-interleaving process between distributed acquisition components, given that real data samples at full sample rate can be stored in a more compact form relative to down-converted I/Q data samples for an equivalent level of quantization noise in the numerical representation.

Figure 4:
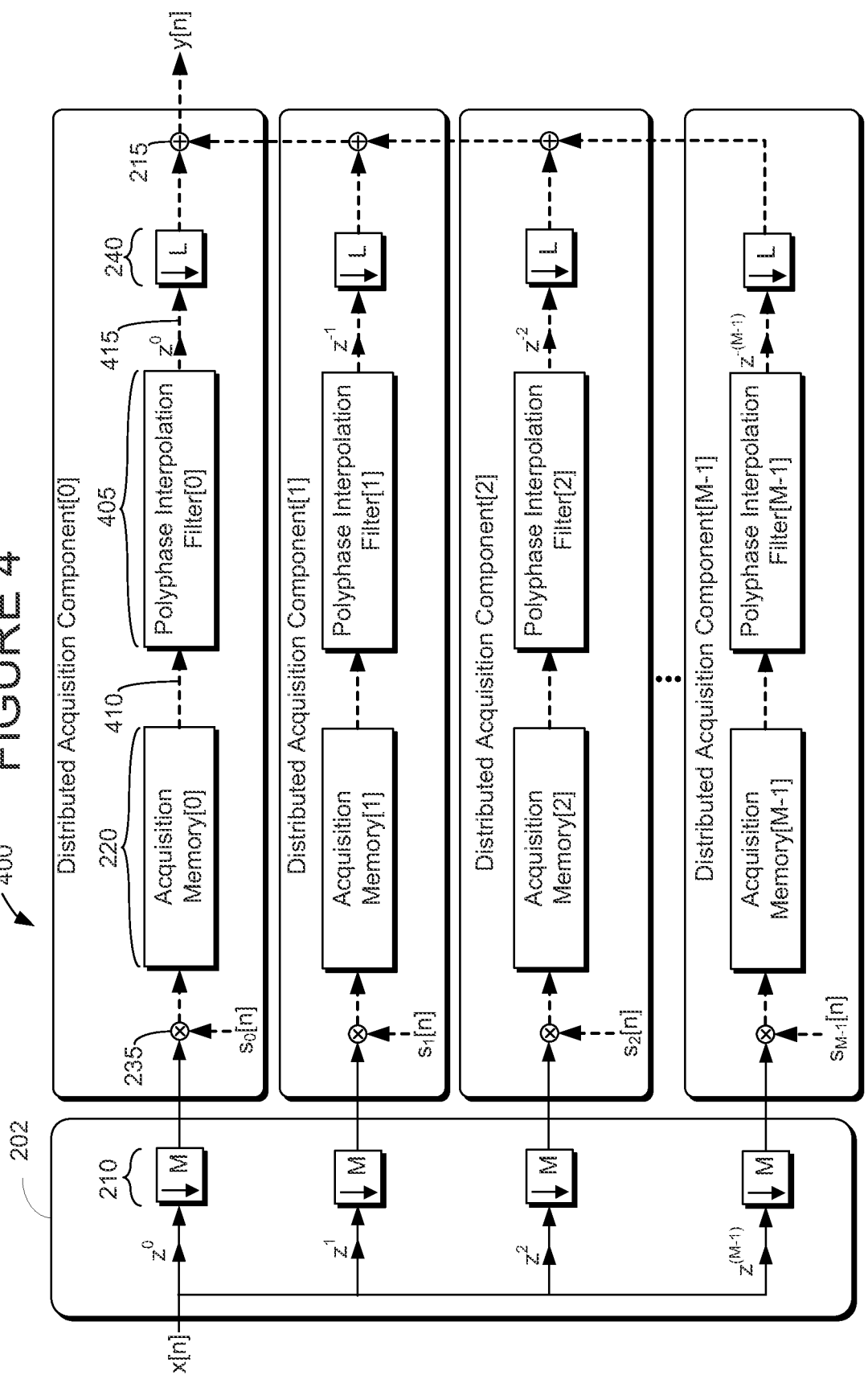
FIG. 4 illustrates a flow diagram including various components of a time-interleaved digital down-conversion system according to yet another example embodiment of the present invention.

FIG. 4 illustrates a flow diagram including various components of a time-interleaved digital down-conversion system 400 according to yet another example embodiment of the present invention. Some of the aspects and/or components of FIG. 4 are discussed above with reference to FIG. 2 and/or FIG. 3, and therefore for the sake of brevity, a detailed description of these is not repeated.

In lieu of the up-sample by M operation performed by up-sampler 205 and the DDC filter H(z) performed by the distributed DDC sections of FIG. 3, a plurality of polyphase interpolation filters, including for example polyphase filter 405, are associated with the distributed acquisition components resulting in a system with equivalent functionality. Here, the NCO component using mixer and/or multiplier 235 of the DDC operation is disposed ahead of each acquisition memory 220 of each of the distributed acquisition components. In other words, the mixer component 235 is coupled to an input of the corresponding acquisition memory 220. In this embodiment, the mixer component 235 receives and multiplies the corresponding portion of the digitized samples with the associated portion of the complex sinusoidal NCO waveform s[n], and produces a frequency-shifted signal having mathematical real and imaginary parts.

This is possible since the mixing operation is commutative with the up-sample operation. Moreover, the mixing operation is made part of the real-time acquisition functions. As a result, the acquisition data is stored in the acquisition memory as complex I/Q data samples instead of raw real acquisition data values, both at full sample rate. The polyphase interpolation filter 405 is coupled to an output of the acquisition memory 220, receives and filters the complex I/Q data samples 410 from the acquisition memory, and outputs filtered data 415. There are delay stages following the polyphase interpolation filter to compensate for the relative sampling phase offsets between distributed acquisition components. One or more down-samplers 240 are coupled to an output of the polyphase interpolation filter (and following delay stages) and are configured to down-sample the filtered signal to a sample rate appropriate for the desired frequency span of interest. The down-sampled and filtered signals are then de-interleaved using, for example, the one or more summers 215.

In this example embodiment, the NCO implementation is interleaved, where each NCO in each of the distributed acquisition components has relative phase offsets by appropriate amounts that correspond to the given acquisition component's relative alignment to the interleaved sample time offsets, for example, as determined by a high-bandwidth sampler such as the track and hold component 202. In other words, the NCO waveforms in each of the distributed acquisition components are aligned on a sample by sample basis. For instance, this is achieved by aligning to a start of acquisition, which is aligned between the distributed acquisition components.

The NCO waveform in each distributed acquisition component can be defined by:

$$s_m[n] = e^{-j\frac{2\pi f_c}{f_s}\left[n + \frac{m}{M}\right]} = \cos\left(\frac{2\pi f_c}{f_s}\left[n + \frac{m}{M}\right]\right) - j \cdot \sin\left(\frac{2\pi f_c}{f_s}\left[n + \frac{m}{M}\right]\right)$$

where $f_c$ is the desired and/or selected center frequency of the acquisition span of interest, $f_s$ is the effective aggregate sample rate of the acquisition system, n is the integer discrete-time sample index for a given distributed acquisition component, m is the relative time-interleaved sampling phase (i.e., from 0 to M−1) of a given distributed acquisition component, M is the total number of distributed acquisition components in the interleaved acquisition system (i.e., interleaved chain of distributed acquisition components), and j is the imaginary unit to signify a complex number notation. The NCO waveform is defined by a complex waveform having mathematical real and imaginary parts.

Figure 5:
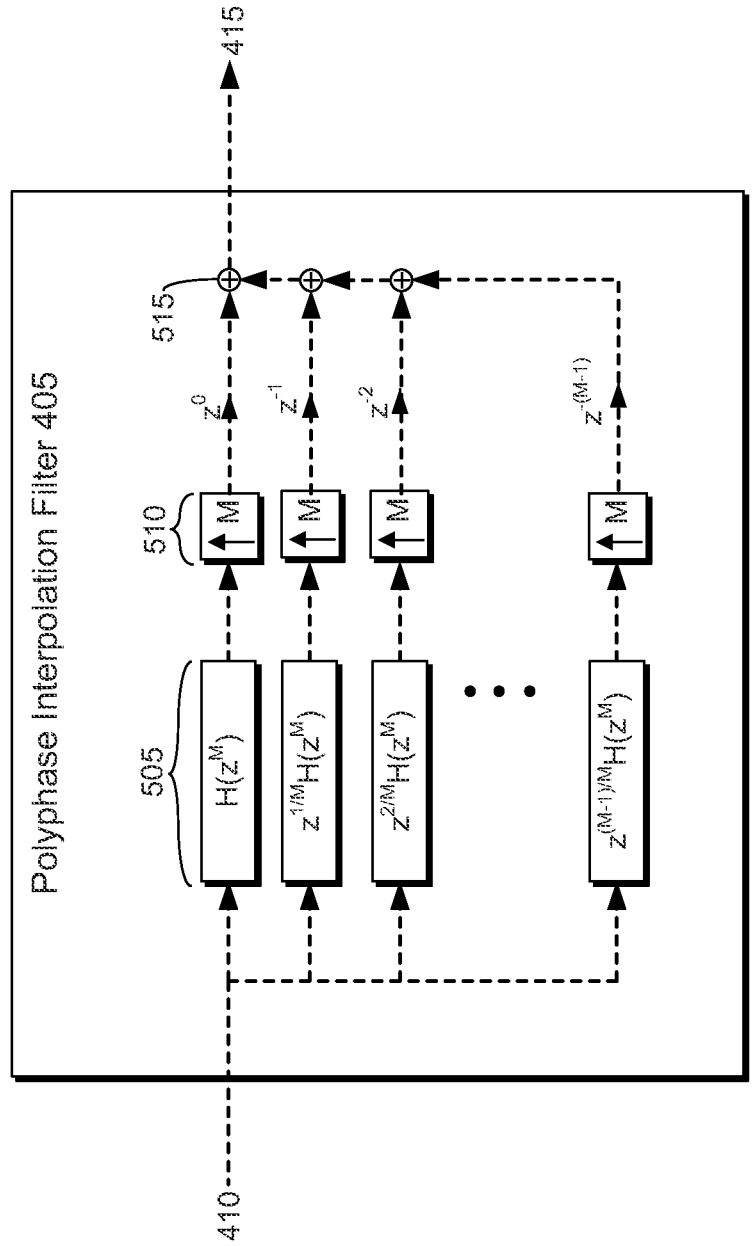
FIG. 5 illustrates a flow diagram including various components of a polyphase interpolation filter of FIG. 4.

FIG. 5 illustrates a flow diagram including various components of a polyphase interpolation filter 405 of FIG. 4. The polyphase interpolation filter 405 receives the complex I/Q data samples 410 from the acquisition memory, filters the data using one or more of the filters 505, and up-samples the data by a factor of M using up-sampler 510 followed by delay stages that correspond to the relative phase of a given parallel polyphase filter path. Summer 515 is used to combine the parallel polyphase filter paths to complete the polyphase interpolation filter implementation. The filtered data is output as data 415 from the polyphase interpolation filter 405.

The ideal frequency response of the filters 505 of the polyphase interpolation filter 405 is of the following form in the frequency domain (expressed as a z-transform) for each polyphase phase, m:

$$H_m(z) = z^{\frac{m}{M}} \cdot H(z^M),$$
$$m \in [0:M-1]$$

where m is the relative polyphase phase (from 0 to M−1) of the parallel filter paths 505 within each of the distributed acquisition components and M is the total number of polyphase components of the interpolation filter 405, which is equivalent to the total number of distributed acquisition components in the interleaved processing chain of distributed acquisition components. It will be understood that while the ideal frequency response of the polyphase interpolation filters 505 set forth above represents a preferred embodiment of the invention, an approximation of the ideal filter response as well as alternate filter topologies can be used.

In the time domain, each of the polyphase filter components is equivalent to down-sampling the overall digital-down converter (DDC) filter impulse response, h[n], with a fractional phase shift of m/M samples, referenced at the down-sampled sample rate, or m samples/filter taps referenced at the original sample rate before down-sampling. This can be shown in the following expression, which is a time-domain representation of $H_m(z)$ described above:

$$h_m[n] = h[M \cdot n + m]$$

$$m \in [0:M-1]$$

Referring now to FIG. 4 and FIG. 5, the down-sampling by L operation of down-sampler 240 occurs after the polyphase interpolation filter section 405 and the subsequent delay stages to compensate for the relative sampling phase offsets between distributed acquisition components. This results in phases of the polyphase interpolation filter that are never used, as the related output samples for the polyphase phases are always discarded. Thus, in an optimization of the polyphase interpolation filter section 405, the phases that are never used can be removed from the polyphase filter structure, thereby conserving hardware and reducing the cost of the system implementation.

For example, the down-sample factor L is determined by the desired output sample rate for a given bandwidth span; and once the down-sample factor L is equal to the distributed acquisition component interleave factor M, then only one phase of the overall polyphase interpolation filter shown in FIG. 5 is actually needed in each of the distributed acquisition components. Hence, each of the distributed acquisition components (e.g., [0], [1], [2], . . . , [M−1] time-interleaved sampling phases) in the interleaved system illustrated in FIG. 4 can use a different phase of the polyphase interpolation filter 405, given the relative sampling time offset present between the distributed acquisition components. For instance, the acquisition component[0] can use phase m=0, the acquisition component[1] can use phase m=M−1, the acquisition component[2] can use phase m=M−2, and the acquisition component[M−1] can use phase m=1, and so forth. In this scenario, the relative delay associated with the filter response, $z^{m/M}$, would be effectively cancelled out with the delay $z^{-m}$ following the up-sampler section 510 in the polyphase parallel filter path phase used for a given distributed acquisition component as a result of the Noble identity, resulting in an effective filter response of $H(z^M)$ in all of the distributed acquisition components.

Figure 6:
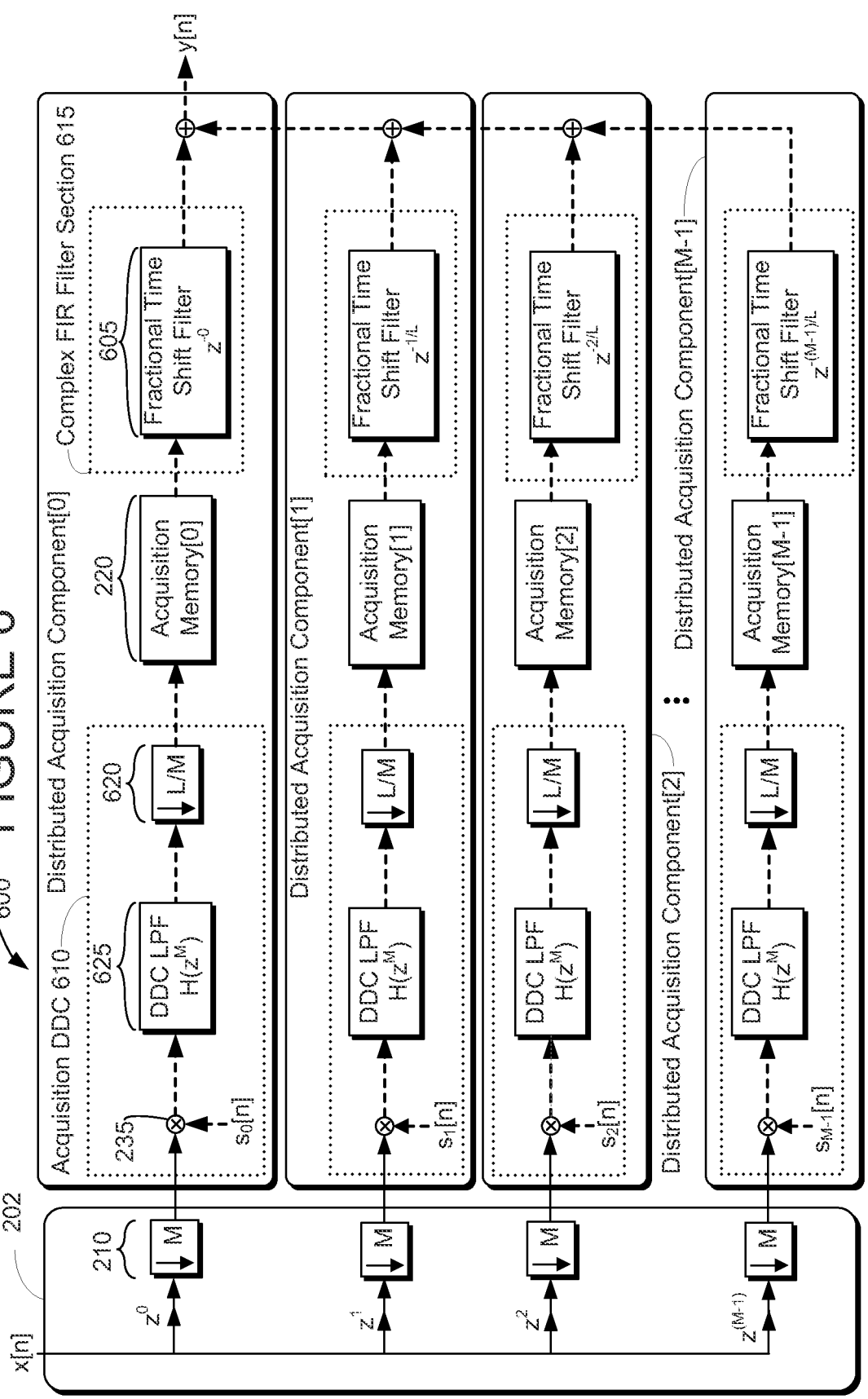
FIG. 6 illustrates a flow diagram including various components of a time-interleaved digital down-conversion system according to still another example embodiment of the present invention.

FIG. 6 illustrates a flow diagram including various components of a time-interleaved digital down-conversion system 600 according to still another example embodiment of the present invention. Some of the aspects and/or components of FIG. 6 are discussed above with reference to FIGS. 2, 3, and/or 4, and therefore for the sake of brevity, a detailed description of these is not repeated.

In this embodiment, the acquired data is decimated in real-time prior to being stored in the acquisition memory 220 of each of the distributed acquisition components [0], [1], [2], . . . , [M−1]. This allows for acquiring longer time spans to memory as the bandwidth span can be reduced from full bandwidth in real-time given a fixed record length available in memory, compared to the requirement to store real data samples at full sample rate in the previous embodiments listed in this disclosure. In spectrum analyzer applications, for example, the minimum resolution bandwidth (RBW) specification and the maximum RF time domain time span duration specifications are therefore improved for a given fixed sized acquisition memory.

More specifically, each of the distributed acquisition components includes an acquisition digital down-converter (DDC) section 610 disposed before the acquisition memory 220 and a complex finite impulse response (FIR) filter section 615 disposed after the acquisition memory 220 along each distributed acquisition component data path. The complex FIR filter section 615 can be implemented by various means, including FFT-based block convolution techniques. The DDC section 610 includes an all-pass and/or low-pass filter 625, whereas the complex FIR filter section 615 has a fractional time-shift filter response. The fractional time-shift filter is a result of transposing the delay stages present after the polyphase interpolation filters in FIG. 4 (to compensate for the relative sampling phase offsets between the distributed acquisition components) to occur after the down-sample by L stage (section 240 in FIG. 4) through use of the Noble identity, as described in further detail below. The ideal frequency response of the filter 625 associated with the DDC section 610 can be decomposed in each of the distributed acquisition components, and provided as follows (expressed as a z-transform):

$$H_m(z) = z^{\frac{-m}{M}} \cdot H(z^M) = T_m(z) \cdot V(z)$$

$$T_m(z) = z^{\frac{-m}{M}}$$

$$V(z) = H(z^M)$$

$$m \in [0:M-1],$$

where m is the relative time-interleaved sampling phase (i.e., 0 to M−1) of a given distributed acquisition component, M is the total number of distributed acquisition components in the interleaved chain of distributed acquisition components and V(z) is a down-sampled version of the original DDC low-pass filter (i.e., H(z) down-sampled by M). The $T_m(z)$ filter component is described in further detail below. In the frequency domain, down-sampling by M is equivalent to folding the spectrum by a factor of M, with aliasing if H(z) has any frequency content above $F_S/(2*M)$, where $F_S$ is the total sample rate of the time-interleaved acquisition system. It will be understood that while the ideal frequency response of the filter 625 associated with the DDC section 610 set forth above represents a preferred embodiment of the invention, an approximation of the ideal filter response can be used as well as alternate filter topologies.

If the DDC down-sample factor L is equal to the interleave factor M, and H(z) is an ideal low-pass filter, then the cut-off frequency of the ideal DDC low-pass filter is $F_S/(2*M)$ to support an overall decimation by M. When the spectrum of H(z) is folded M times to obtain the spectrum of V(z) (i.e. down-sampled version of H(z)), this effectively results in an ideal all-pass filter for V(z), so in this case, the filter response becomes a trivial discrete-time impulse function and thus does not require an actual filter to be implemented. That is, $V(z)=1 \rightarrow v[n]=\delta[n]$, where n is the discrete-time sample index and $\delta[n]$ is a discrete-time impulse centered at n=0, which is given as follows:

$$\delta[n] = \begin{cases} 1, & n = 0 \\ 0, & n \neq 0 \end{cases}$$

The other component of the expression set forth above, $T_m(z)$, represents a fractional time-shift filter which compensates for the relative sampling phase offsets between distributed acquisition components, where the time is shifted by m/M samples for a given distributed acquisition component time-interleave sampling phase m, when referenced at the full sample rate of a given distributed acquisition component. This filter can be implemented with an all-pass (or appropriate low-pass) filter that has a linear phase response with slope m/M.

This example embodiment is particularly useful if the DDC down-sample factor L is greater than the interleave factor M. When the DDC down-sample factor L is greater than the interleave factor M, the residual down-sample factor L/M effected by down-sampler 620 can be disposed ahead of a fractional time shift filter 605, and ahead of the acquisition memory 220, in the real-time distributed acquisition component data path, as shown in FIG. 6. The decomposed polyphase filter structured between acquisition components has an implicit down-sampling by M built into the path (e.g., 210) by virtue of time-interleaving of the input x[n] data samples between the distributed acquisition components, and hence, the residual down-sample L/M remains.

In the scenario where L>M, V(z) becomes a low-pass filter, as the original system DDC low-pass filter has a cutoff frequency of $\leq F_S/(2*L)$, which is below the Nyquist frequency of the new sample rate after down-sampling by L/M. The new Nyquist frequency is $F_S/(2*L)$ after the down-sample operation.

Furthermore, rather than being disposed in front of the residual down-sample by L/M operation, the fractional time shift filter 605, represented by $T_m(z)$ as set forth above, can be disposed after the down-sample operation and after the acquisition memory 220 along the data path of each of the distributed acquisition components. Moreover, the filter can be transformed using the Noble identity, which effectively transforms the filter to operate at a lower sample rate after down-sampling by L/M (relative to the full sample rate of a given distributed acquisition component), to result in the following filter, $T'_m(z)$, expressed as a z-transform:

$$T'_m(z) = T_m\left(z^{\frac{1}{L/M}}\right)$$

$$T'_m(z) = z^{\frac{-m}{M} \cdot \frac{M}{L}} = z^{\frac{-m}{L}}$$

$$m \in [0:M-1]$$

where m is the relative time-interleaved sampling phase (i.e., 0 to M−1) of a given distributed acquisition component, M is the total number of distributed acquisition components in the interleaved chain of distributed acquisition components, and L is the inherent down-sample factor as a desired and/or selected sample rate reduction factor for a given bandwidth span relative to the aggregate input sample rate of the time-interleaved acquisition system. It will be understood that while the ideal frequency response of the fractional time shift filter 605 set forth above represents a preferred embodiment of the invention, an approximation of the ideal filter response can be used as well as alternate filter topologies.

Given the re-ordering of operations enabled by these transformations, the down-sampled low-pass filter 625, V(z), and down-sample by L/M operation by down-sampler 620 described above, can be moved in the real-time acquisition path ahead of the acquisition memory 220 in each of the distributed acquisition components (e.g., [0], [1], [2], . . . , [M−1]). The filter 625, V(z), and down-sampled by L/M operation 620 can be implemented by various means, including polyphase decimating half-band finite impulse response (FIR) stages. When the NCO and mixer 235 stage is used in association with V(z) at 625 and the down-sample by L/M operation at 620, it effectively results in the same operation as a general DDC block. Therefore, a general DDC block used to support a single acquisition component operation can be adapted to support time-interleaved DDC operation across multiple distributed acquisition components.

In addition, the fractional time-shift filter, $T'_m(z)$, can also be implemented to complete the interleaved DDC operation in post-processing (i.e. after acquisition data is stored to memory). The complex FIR section 615 (or any other means to implement the filter, such as FFT-based block-convolution techniques) can be used to implement this filter in post-processing an acquisition data record in memory to recombine the interleaved acquisition samples into a resulting coherent waveform, y[n]. A different filter can be loaded into or otherwise associated with each distributed acquisition component to compensate for that component's relative sampling phase offset, as each distributed acquisition component preferably includes a unique fractional time-shift filter response.

For instance, fractional time-shift filter $z^{-0}$ can be associated with acquisition component[0], fractional time-shift filter $z^{-1/L}$ can be associated with acquisition component[1], fractional time-shift filter $z^{-2/L}$ can be associated with acquisition component[2], fractional time-shift filter $z^{-(M-1)/L}$ can be associated with acquisition component[M−1], and so forth, as shown in FIG. 6. Coherent down-converted complex baseband I/Q data samples are available to support downstream processes and/or clients following the de-interleave summation in the last of the distributed acquisition components (i.e., [0]) in the interleave processing chain, as shown by y[n] in FIG. 6.

Figure 7:
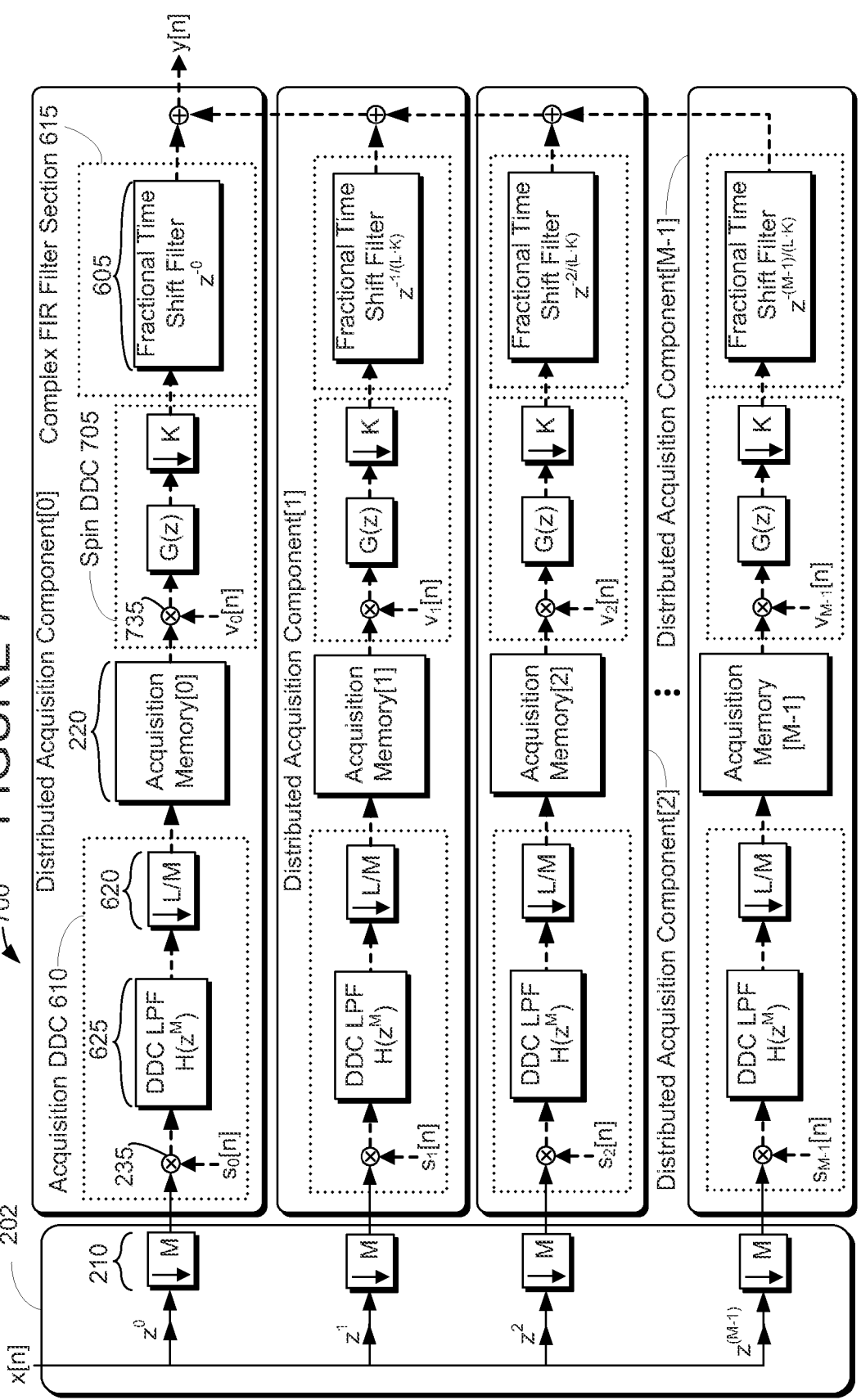
FIG. 7 illustrates a flow diagram including various components of a time-interleaved digital down-conversion system with a secondary digital-down conversion stage after acquisition memory according to an example embodiment of the present invention.

FIG. 7 illustrates a flow diagram including various components of a time-interleaved digital down-conversion system 700 with a secondary digital-down conversion stage that is applied when processing previously acquired data in memory according to an example embodiment of the present invention. Some of the aspects and/or components of FIG. 7 are discussed above with reference to FIGS. 2, 3, 4, and/or 6 and therefore for the sake of brevity, a detailed description of these is not repeated.

From a system perspective, this essentially breaks up the digital down-conversion into two stages: one before the acquisition memory 220, namely acquisition DDC section 610, and one after the acquisition memory 220, namely spin DDC section 705. The fractional time-shift filter 605 can be adjusted to match the overall decimation amount, so essentially the fractional time-shift filter becomes related to a factor of the product of L and K for the total down-sample rate to become (expressed as a z-transform):

$$T''_m(z) = T'_m(z^{\frac{1}{K}}) = z^{\frac{-m}{LK}},$$
$$m \in [0:M-1]$$

where m is the relative time-interleaved sampling phase (i.e., 0 to M−1) of a given distributed acquisition component, M is the total number of distributed acquisition components in the time-interleaved chain of distributed acquisition components, L is the inherent down-sample factor as a desired and/or selected sample rate reduction factor for a given bandwidth span relative to the aggregate input sample rate of the time-interleaved acquisition system, and K is the effective decimation rate of any additional digital down-conversion/decimation that occurs after acquisition data is stored to acquisition memory. It will be understood that while the ideal frequency response of the fractional time-shift filter 605 set forth above represents a preferred embodiment of the invention, an approximation of the ideal filter response can be used as well as other filter topologies.

The resulting time-interleaved two-stage DDC operation is shown in FIG. 7. This embodiment can be implemented with a combination of the acquisition DDC section (i.e., real-time DDC) 610, spin DDC section (i.e., secondary post-processing DDC) 705, and the complex FIR filter section 615 as shown in FIG. 7. The spin DDC section 705 is coupled to an output of the acquisition memory 220 and to an input of the complex FIR filter section 615.

In the spin DDC section 705, $v_m[n]$ represents a second complex sinusoidal waveform used in the NCO and/or mixing process used in the spin DDC section, which is an interleaved NCO that can work in a similar fashion to that of the NCO in the acquisition DDC section 610. In other words, the mixer and multiplier 735 can mix the second complex sinusoidal waveform $v_m[n]$ with the down-converted samples received from the acquisition memory 220, thereby applying an additional frequency offset to shift the acquired spectrum before additional filtering and decimation. In addition, this approach allows for "zooming" within an acquired spectrum to a desired subset of the acquired frequency span range.

A different filter can be loaded into or otherwise associated with each distributed acquisition component to compensate for that component's relative sampling phase offset. For instance, fractional time-shift filter $z^{-0}$ can be associated with acquisition component[0], fractional time-shift filter $z^{-1/(L-K)}$ can be associated with acquisition component[1], fractional time-shift filter $z^{-2/(L-K)}$ can be associated with acquisition component[2], fractional time-shift filter $z^{-(M-1)/(L-K)}$ can be associated with acquisition component[M−1], and so forth, as shown in FIG. 7.

As is likewise the case for the example embodiment shown in FIG. 6, coherent down-converted complex baseband I/Q data is available to support downstream processes and/or clients following the de-interleave summation in the last of the distributed acquisition components (i.e., [0]) in the interleave processing chain, as shown by y[n] in FIG. 7.

Figure 8:
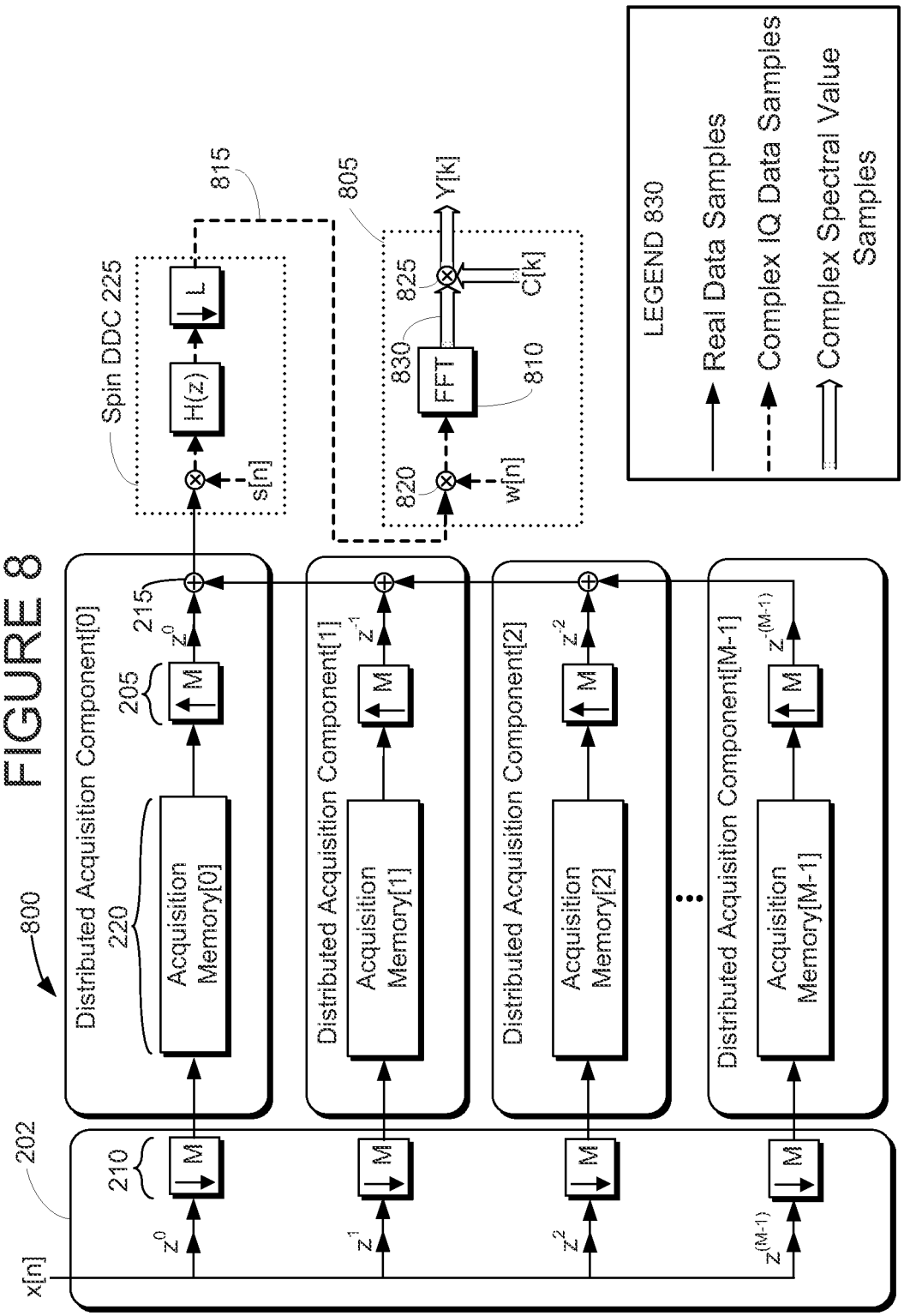
FIG. 8 illustrates a flow diagram including various components of a time-interleaved digital down-conversion system according to another example embodiment of the present invention.

FIG. 8 illustrates a flow diagram including various components of a time-interleaved digital down-conversion system 800 according to another example embodiment of the present invention. Some of the aspects and/or components of FIG. 8 are discussed above with reference to FIGS. 2, 3, 4, 6, and/or 7 and therefore for the sake of brevity, a detailed description of these is not repeated.

Supporting interleaved DDC acquisition and post-processing operations are useful building blocks for enabling spectral (i.e. frequency-domain) waveform display and processing. For instance, components of an MDO architecture when integrated with the inventive aspects of time-interleaved DDC acquisition systems as described above, can be used for spectral DPX® display and/or processing in time-interleaved acquisition systems.

This embodiment is particularly useful when real data samples need to be acquired into the acquisition memories (e.g., 220) of the distributed acquisition components (e.g., [0], [1], [2], . . . , [M−1]) due to wide span bandwidths, and the like. In this embodiment, the acquisition DDC section and associated operations discussed above, need not be used. This example embodiment is similar to the one illustrated in FIG. 2, although notably with the addition of the frequency transform section 805 following the spin DDC section 225. The frequency transform section 805 provides a windowing operation using window function w[n], FFT operation using FFT 810, and/or frequency response correction using filter response C[k], which can include corrections to amplitude flatness and/or phase over frequency, the details of which are expounded upon below.

By convention, as shown in legend 830, the solid line arrows represent real data samples and/or data paths, and the broken line arrows represent complex I/Q data samples and/or data paths. In addition, the thick outlined arrows following the FFT operation 810 represent spectral (i.e. frequency domain) value samples, including mathematical real and imaginary components. This convention also applies to the following figures, even though the legend is not displayed in every figure.

In the frequency transform section 805, the multiplier 820 multiplies the complex signal 815 by the window function, w[n], in the time domain prior to the FFT operation at 810. In some embodiments, the window function w[n] is a real value function, although it will be understood that the window function w[n] can be a complex window function as well.

Further, the multiplier 825 multiplies the signal 830 received from the FFT 810 by the amplitude and/or phase correction filter response, C[k], in the frequency domain after the FFT operation at 810. The windowing, FFT, and amplitude and/or phase correction operations can be performed in the frequency transform section 805. The resulting coherent spectral output waveform, Y[k], can be used with downstream spectral analysis and display functions.

The spin DDC section 225 is coupled to the summer 215 in the last distributed acquisition component (i.e., [0]). The frequency transform section 805 is coupled to the spin DDC section 225, and is configured to transform the complex time-domain data samples to complex spectral samples.

Figure 9:
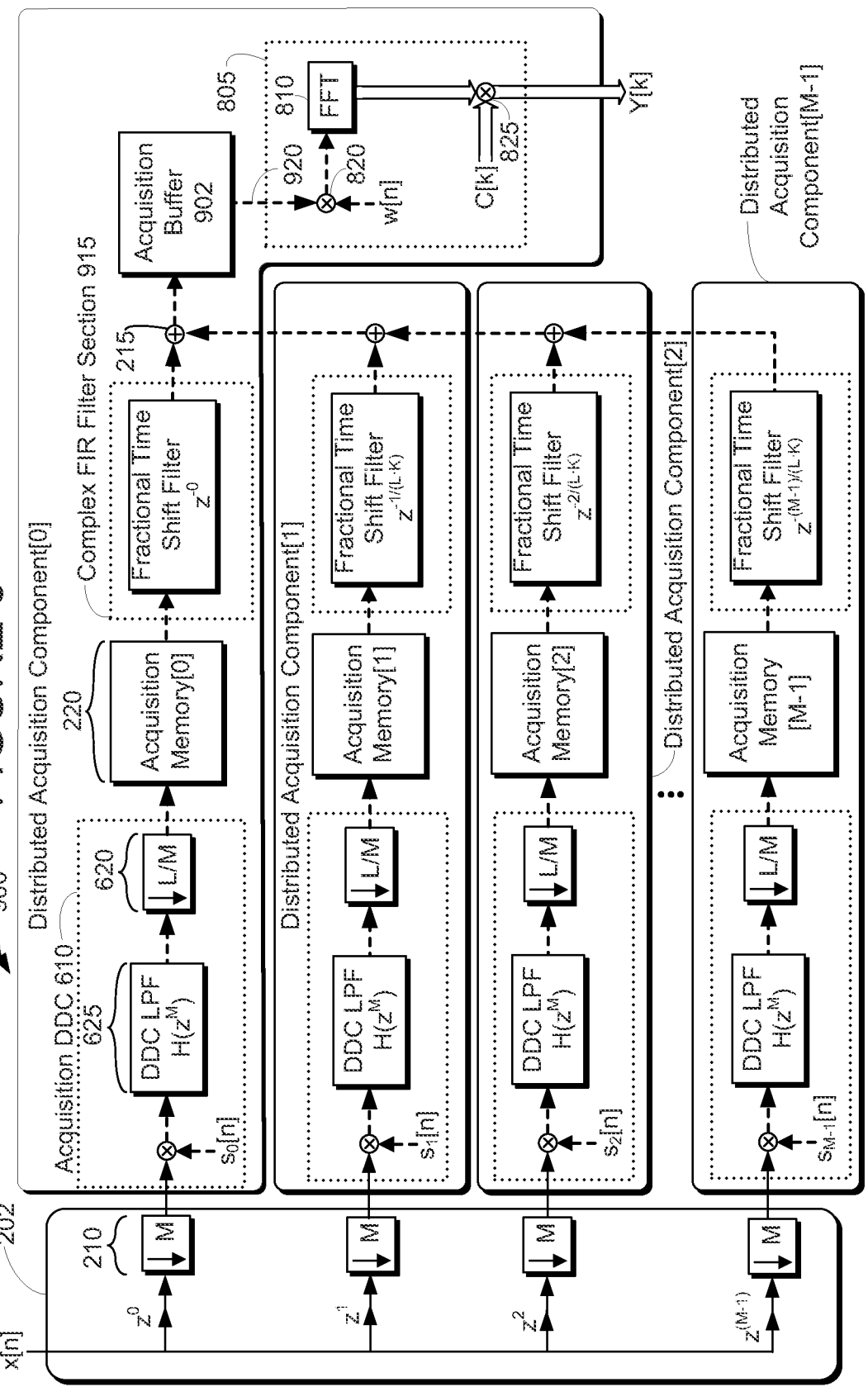
FIG. 9 illustrates a flow diagram including various components of a time-interleaved digital down-conversion system according to yet another example embodiment of the present invention, for cases where spectral output data in the frequency domain is of interest.

FIG. 9 illustrates a flow diagram including various components of a time-interleaved digital down-conversion system according to yet another example embodiment of the present invention. Some of the aspects and/or components of FIG. 9 are discussed above with reference to FIGS. 2, 3, 4, 6, 7, and/or 8 and therefore for the sake of brevity, a detailed description of these is not repeated.

This example embodiment is similar to the embodiment of FIG. 6, which includes an interleaved DDC data flow where down-converted complex I/Q data samples are stored into the acquisition memory 220 of each of the distributed acquisition components (e.g., [0], [1], [2], . . . , [M−1]). Similarly, fractional time-shift filtering is applied with the complex FIR filter section 915 (or any equivalent implementation) to assist in de-interleaving data between the multiple distributed acquisition components to obtain coherent I/Q data samples in the last acquisition component (i.e., [0]) in the post-processing interleaved stream. This approach is particularly useful in scenarios where the total span bandwidth results in a DDC decimation factor that is greater than the number of distributed acquisition components in the time-interleaved system, and thus, some decimation can be applied before storing data into the acquisition memory 220.

In FIG. 9, down-converted complex baseband I/Q data is acquired into the acquisition memory 220 of each of the distributed acquisition components (e.g., [0], [1], [2], . . . , [M−1]) of the interleaved chain. Fractional time-shift filtering is performed as a post-processing operation using the complex FIR filter section 915. In this example embodiment, data is de-interleaved through summation using, for example, summer 215, after the fractional time-shift filter is applied using the complex FIR filter section 915 in each of the distributed acquisition components post-processing stream. The resulting coherent de-interleaved waveform data can be stored to an acquisition buffer 902, which can be located in the acquisition memory 220 of the last acquisition component (i.e., [0]) in the interleave processing chain, or as an entirely separate memory buffer.

The conversion to spectral (i.e. frequency domain) data samples is applied using the frequency transform section 805 only in the last distributed acquisition component (i.e., [0]). Spectral conversion functions such as windowing, FFT, and amplitude flatness and/or phase correction filtering, as described above with reference to FIG. 8, are applied to the complex data samples 920 processed from the acquisition buffer 902. As an alternative embodiment, coherent time domain acquisition data samples (i.e., as a result of de-interleaving/summation by section 215 in each of the distributed acquisition components) can be directly streamed to the frequency transform section 805, without requiring intermediate storage to acquisition buffer section 902.

Although illustrated separately in FIG. 9, the complex FIR filtering section 915 can be the same section as the frequency transform section 805, but used at two different times, if the FFT block is used to implement the complex FIR filtering using block convolution techniques. In other words, where they are the same component, the fractional time-shift filtering is applied at 915 and the spectral conversion operations are applied at 805, using essentially the same hardware component in two different post-processing "passes" or "spins" of the data. Alternatively, sections 915 and 805 can be separate one from another and comprised of their own hardware and/or software.

The acquisition buffer 902 is coupled to the one or more summers 215 of the last distributed acquisition component (i.e., [0]). The frequency transform section 805 is coupled to the acquisition buffer 902, and is configured to produce complex spectral (i.e., frequency domain) samples.

One way to reduce the two different post-processing passes to a single post-processing pass is to move the de-interleave section, including for example, the summer 215, ahead of the complex FIR section 915 in the last acquisition component (i.e., [0]) only (not shown). The distributed acquisition component[0] has a trivial fractional time-shift filter (i.e., time shift of 0), and therefore, no special filtering is required by that particular complex FIR section 915 associated with acquisition component[0]. Hence, the complex FIR filter section 915 associated with acquisition component[0] can be repurposed to perform the spectral conversion function (i.e., when the complex FIR filter section is implemented as a FFT-based block convolution) after the de-interleave operation is complete. In such case, the acquisition buffer 902 is not needed, because no intermediate data is stored between passes, but rather, the data flows in-line through the post processing stream.

In any case, after the spectral conversion operation at 805 in the last distributed acquisition component (i.e., [0]), the output spectral data, Y[k], can be streamed directly into downstream analysis and display functions in or after the last acquisition component (i.e., [0]) in the interleaved chain.

Figure 10A:
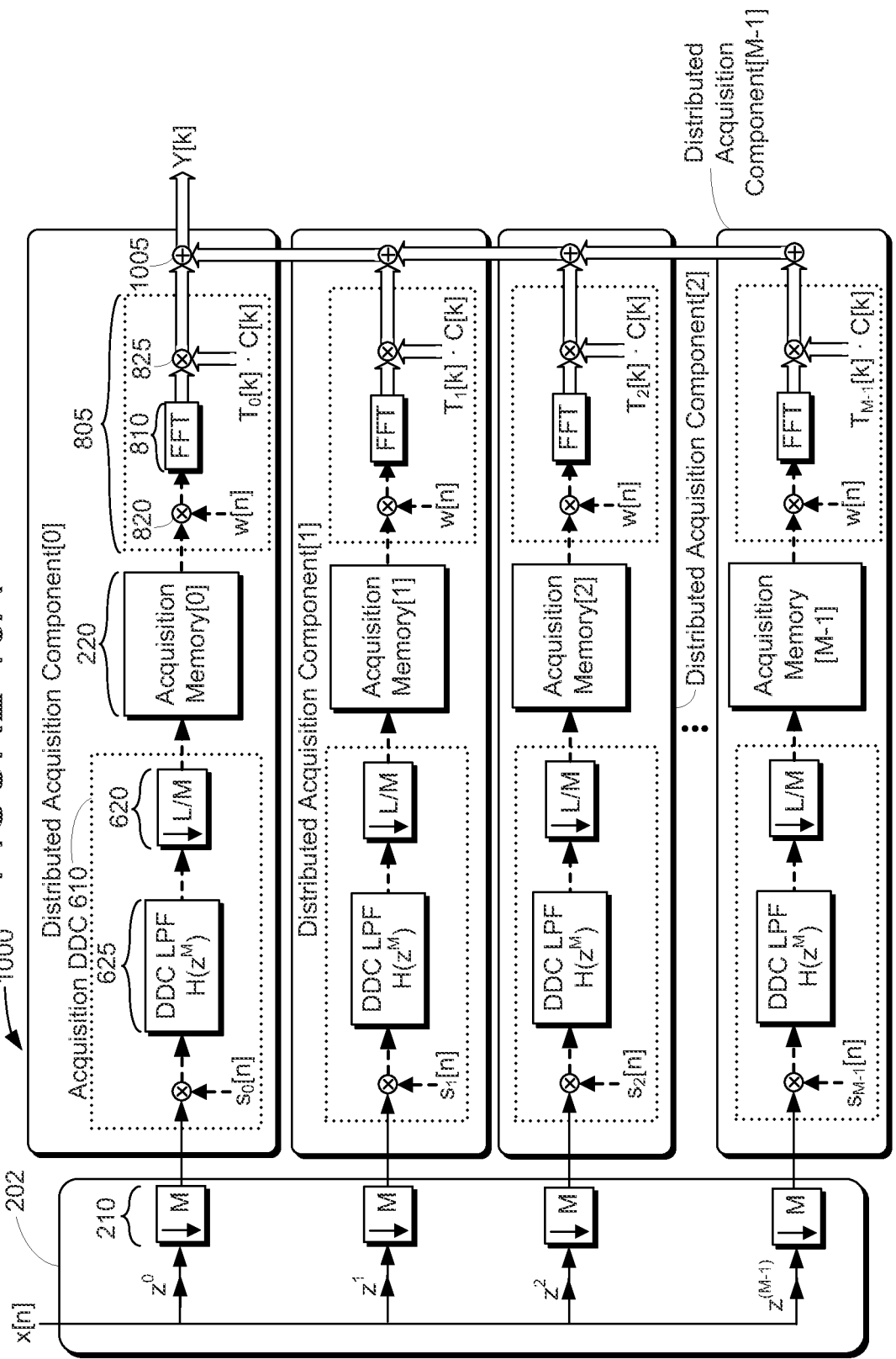
FIG. 10A illustrates a flow diagram including various components of a time-interleaved digital down-conversion system according to still another example embodiment of the present invention, for cases where spectral output data in the frequency domain is of interest.

FIG. 10A illustrates a flow diagram including various components of a time-interleaved digital down-conversion system 1000 according to still another example embodiment of the present invention. Some of the aspects and/or components of FIG. 10A are discussed above with reference to FIGS. 2, 3, 4, 6, 7, 8, and/or 9 and therefore for the sake of brevity, a detailed description of these is not repeated.

Another example embodiment for performing time-interleaved distributed FFT and/or spectral processing with down-converted data stored in the acquisition memory 220 is illustrated in FIG. 10A. Here, the frequency transform section 805 is distributed into each of the acquisition components (e.g., [0], [1], [2], . . . , [M−1]) in the interleaved chain. In addition, the spectral conversion operation (e.g., windowing operation using window function w[n], FFT operation using FFT 810, and amplitude and/or phase correction using filter response C[k]) is combined with the fractional time-shift filter ($T_m'[k]$) by direct multiplication of both filter responses within each of the frequency transform sections (e.g., 915) associated with each of the distributed acquisition components (e.g., [0], [1], [2], . . . , [M−1]).

More specifically, the spectral transform of the fractional time-shift filter, $T_m'[k]$, can be combined with the amplitude flatness and/or phase correction function, C[k]. These can be combined by direct multiplication in the frequency domain. The combination of these two spectral functions can be pre-computed to generate a series of composite filter functions targeted for each distributed acquisition component in the time-interleave system, which can be loaded or otherwise associated with the frequency transform section 805 in each of the distributed acquisition components (e.g., [0], [1], [2], . . . , [M−1]).

In this example embodiment, the frequency transform section 805 of each of the distributed acquisition components is coupled to an output of the corresponding acquisition memory 220. Spectral conversion function such as windowing, FFT, and amplitude flatness and/or phase correction filtering, as described above with reference to FIG. 8, are applied to the complex data samples received from each corresponding acquisition memory 220. Each frequency transform section 805 is configured to produce complex spectral samples for a given distributed acquisition component.

In this example embodiment, the spectral data is de-interleaved by summation using, for example, one or more summers 1005, after the spectral conversion and filtering operations are performed by the frequency transform section 805. In other words, complex spectral data samples (with both real and imaginary components) from the spectral conversion are summed and de-interleaved between the distributed acquisition components (e.g., [0], [1], [2], . . . , [M−1]) in the interleave processing chain. The one or more summers 1005 of each of the distributed acquisition components is coupled to an output of each corresponding frequency transform section 805, and are configured to de-interleave the complex spectral samples received from the frequency transform sections.

When the number of time-domain input data samples becomes close to or greater than the number of FFT output spectral samples in terms of total data size, the example embodiment shown in FIG. 10A is more efficient relative to the embodiment shown in FIG. 9, because it condenses the fractional time-shift filter and frequency transform functions to only require a single FFT operation in each of the distributed acquisition components.

Figure 10B:
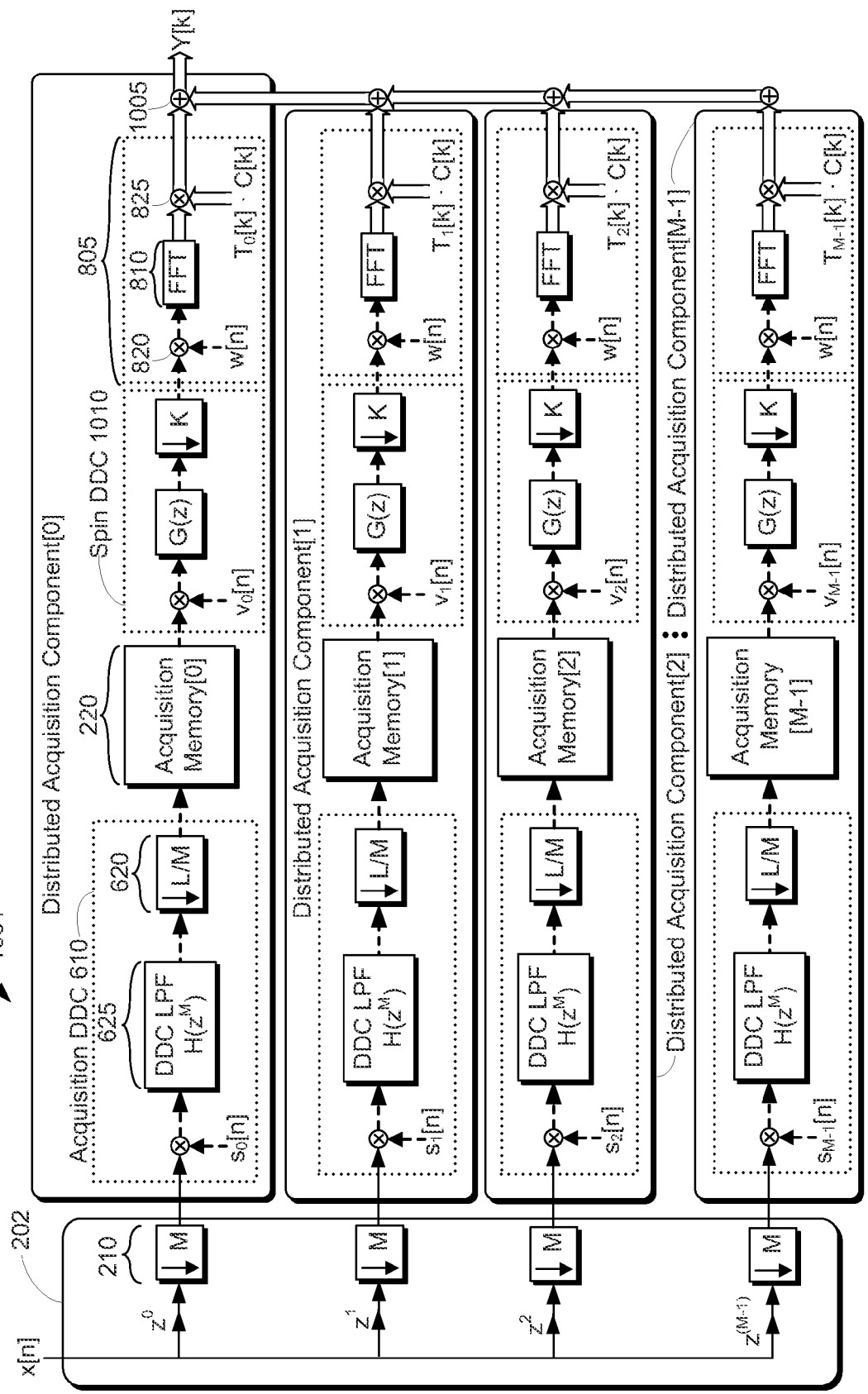
FIG. 10B illustrates a flow diagram including various components of a time-interleaved digital down-conversion system according to another example embodiment of the present invention, for cases where spectral output data in the frequency domain is of interest.

Either of the example embodiments shown in FIGS. 9 and 10A can be extended to support a secondary (i.e., spin) DDC section, in a manner the same or similar to the secondary spin DDC operation shown and described with reference to FIG. 7. For example, FIG. 10B illustrates such an embodiment in which the spin DDC 1010 is disposed between the acquisition memory 220 and the frequency transform section 805 in each of the distributed acquisition components.

Figure 11:
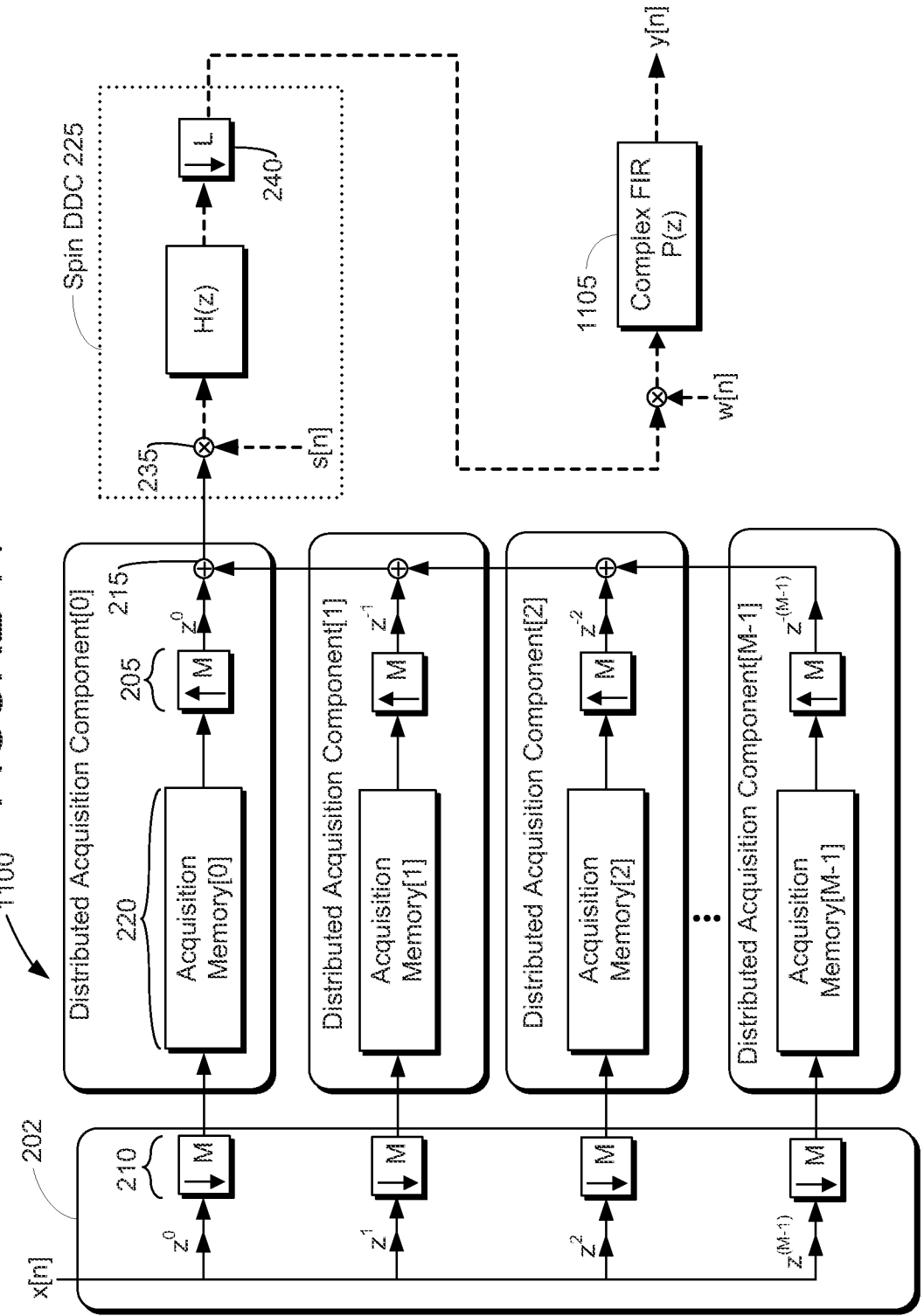
FIG. 11 illustrates a flow diagram including various components of a time-interleaved digital down-conversion system according to yet another example embodiment of the present invention, for cases where a secondary complex FIR filter stage is desired.

FIG. 11 illustrates a flow diagram including various components of a time-interleaved digital down-conversion system 1100 according to yet another example embodiment of the present invention. Some of the aspects and/or components of FIG. 11 are discussed above with reference to FIGS. 2, 3, 4, 6, 7, 8, 9, and/or 10 and therefore for the sake of brevity, a detailed description of these is not repeated.

The time-interleaved distributed DDC concepts described herein can be extended to support RF time-domain waveforms (i.e., down-converted complex baseband I/Q data, amplitude, frequency, phase versus time waveforms, as well as support for any form of demodulation and protocol decoding, and the like) in time-interleaved acquisition systems. In addition to supporting digital down-conversion operations (e.g., spin DDC operations), the amplitude flatness and/or phase correction filtering, using for example complex FIR filter 1105, can be applied to support downstream RF time domain waveform drawing, analysis, demodulation, decoding, and other post-processing functions. In other words, the complex FIR filter 1105 can produce filtered coherent complex baseband I/Q data samples.

The example embodiment of FIG. 11 is similar to that of FIG. 2 in the sense that real data samples are stored into the acquisition memory 220 at full sample rate. In addition, the spin DDC section 225 is disposed after the de-interleaving process. The spin DDC section 225 is disposed after the summation of data samples for de-interleaving across all distributed acquisition components using, for example, one or more summers 215 to produce a coherent waveform; in other words, the summed coherent waveform is received by the spin DDC section 225 for further processing. The spin DDC section 225 is coupled to the one or more summers 215 of the last distributed acquisition component (i.e., [0]). The complex FIR filter section 1105 is coupled to the spin DDC section and produces filtered complex baseband I/Q data samples.

In this example embodiment, the complex FIR filter section 1105 is used to apply the amplitude and/or phase correction filter, P(z). The data is coherent and corrected after the complex FIR filter section 1105, which can be streamed directly into other downstream post-processing functions, include analysis, measurement, display, demodulation, decoding, etc.

Figure 12:
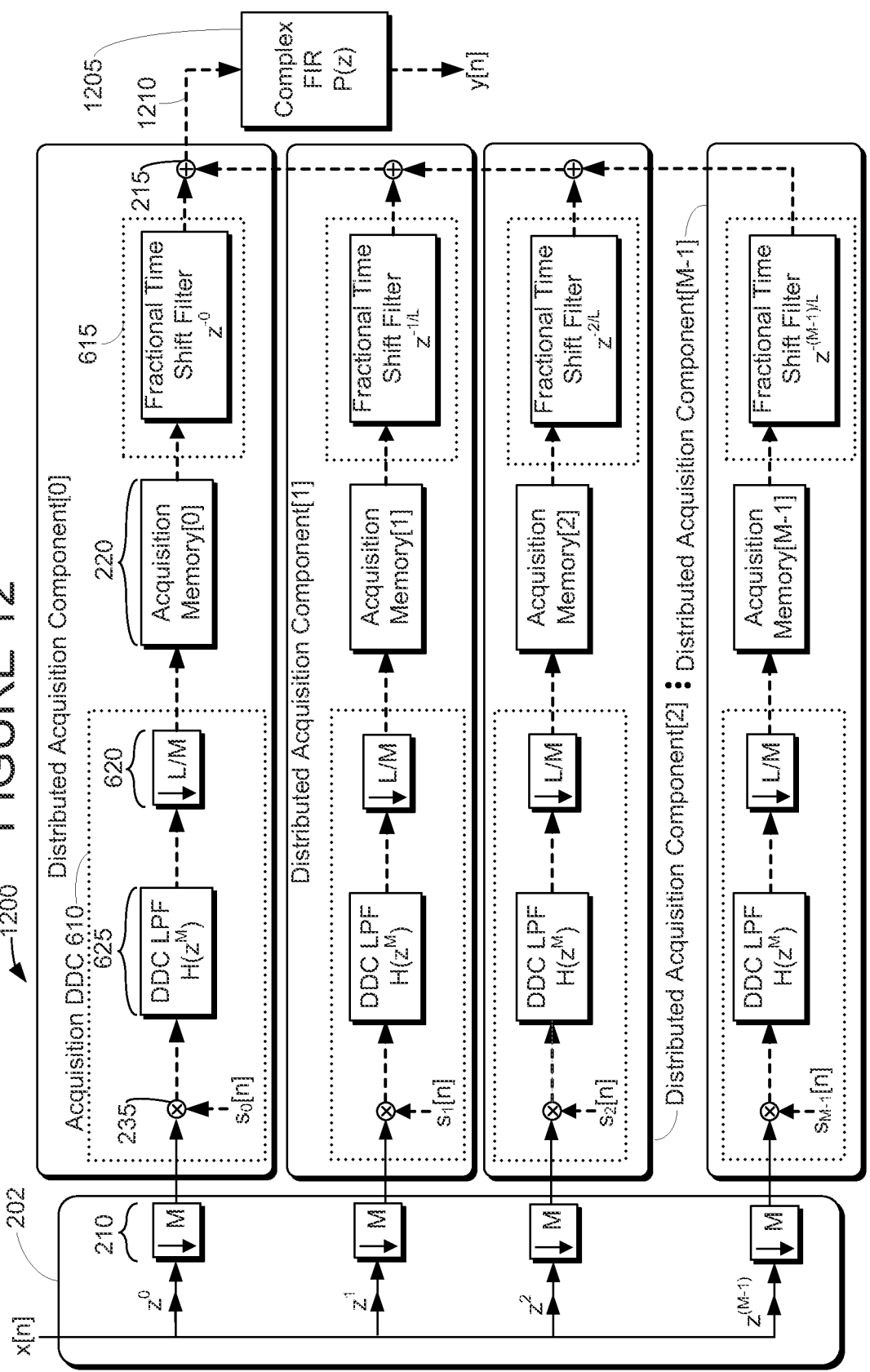
FIG. 12 illustrates a flow diagram including various components of a time-interleaved digital down-conversion system according to yet another example embodiment of the present invention, for cases where a secondary complex FIR filter stage is desired.

FIG. 12 illustrates a flow diagram including various components of a time-interleaved digital down-conversion system 1200 according to yet another example embodiment of the present invention. Some of the aspects and/or components of FIG. 12 are discussed above with reference to FIGS. 2, 3, 4, 6, 7, 8, 9, 10, and/or 11 and therefore for the sake of brevity, a detailed description of these is not repeated.

RF time-domain operation in some test and measurement instruments such as MDOs can support applications that process complex down-converted baseband I/Q data samples in the time domain, such as modulation analysis, or the like. To extend interleaved RF time domain waveform support for cases where complex down-converted data is stored in the acquisition memory, the amplitude flatness and/or phase correction complex FIR filter that is used for RF time domain processing can be added to the time-interleaved distributed DDC data flow illustrated in FIG. 6. For example, the complex FIR filter 1205 illustrated in FIG. 12, is disposed after the one or more summers 215 of the last of the distributed acquisition components (i.e., [0]) in the interleaved processing chain. In this manner, the amplitude flatness and/or phase correction filter, P(z), of the complex FIR 1205 is applied to the summed waveform data 1210.

The complex FIR filter 1205 is coupled to the one or more summers 215 of the last distributed acquisition component (i.e., [0]). Moreover, the complex FIR filter can be configured to produce filtered complex I/Q data samples.

Figure 13A:
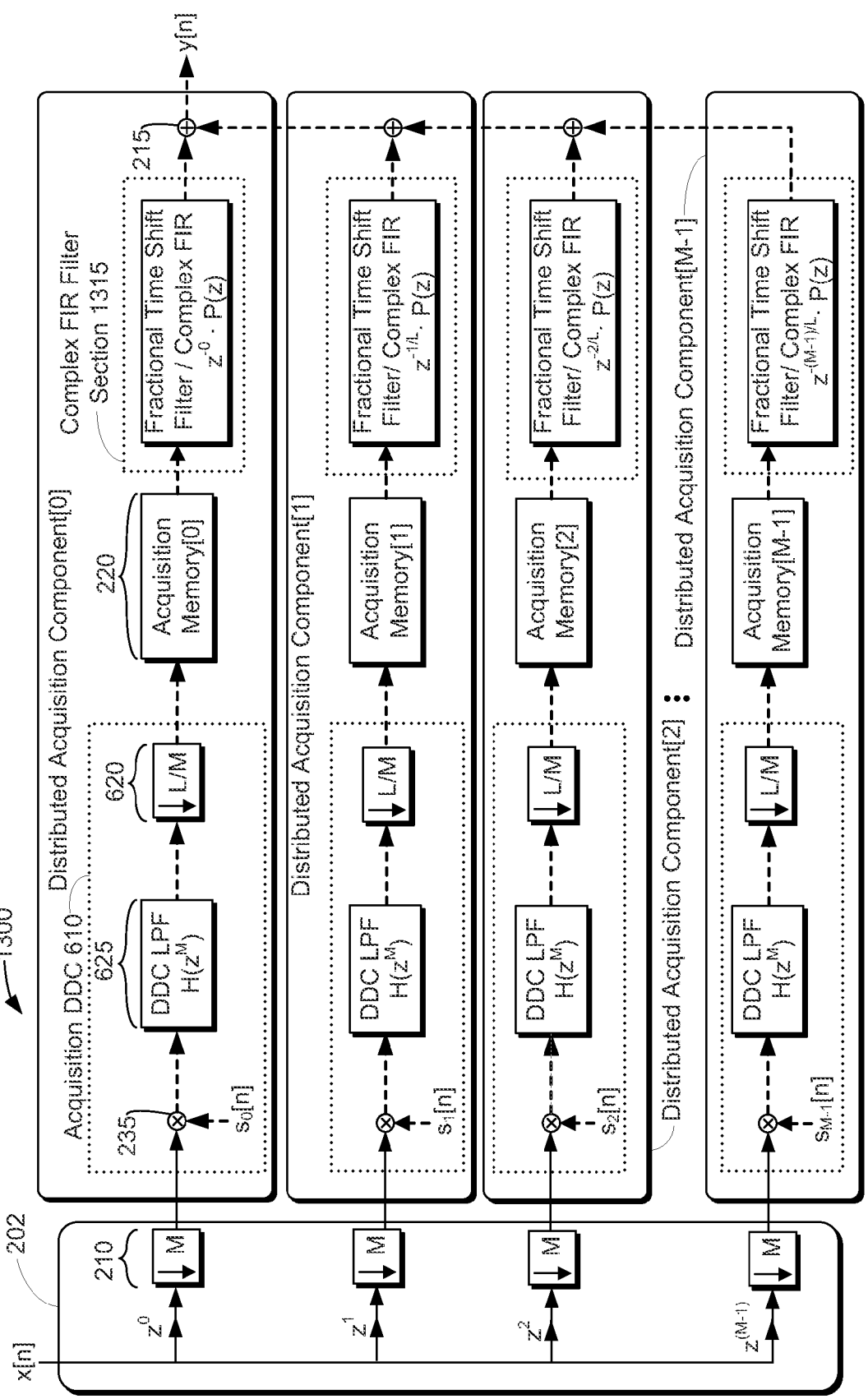
FIG. 13A illustrates a flow diagram including various components of a time-interleaved digital down-conversion system according to still another example embodiment of the present invention, for cases where a secondary complex FIR filter stage is desired.

FIG. 13A illustrates a flow diagram including various components of a time-interleaved digital down-conversion system according to still another example embodiment of the present invention. Some of the aspects and/or components of FIG. 13A are discussed above with reference to FIGS. 2, 3, 4, 6, 7, 8, 9, 10, 11, and/or 12 and therefore for the sake of brevity, a detailed description of these is not repeated.

In this example embodiment, the amplitude flatness and/or phase correction complex FIR filter is distributed into each of the distributed acquisition components (e.g., [0], [1], [2], . . . , [M−1]). The complex amplitude flatness and/or phase correction filter, P(z), and the fractional time-shift filters (e.g., $z^{-0}$, $z^{-1/L}$, $z^{-2/L}$, $z^{-(M-1)/L}$, respectively for each of the distributed acquisition components) can be combined into a single filter operation in each distributed acquisition component using the complex FIR filter section 1315, disposed in each of the distributed acquisition components, as illustrated in FIG. 13A. The combination of these two filters can be performed by convolution of the filter impulse responses in the time domain or multiplication of the filter responses in the frequency domain, and can be pre-computed and loaded as separate composite filters into each of the distributed acquisition components, resulting in the data flow as shown in FIG. 13A.

In this example embodiment, the data is coherent after the de-interleave summation block (i.e., section 215) in the last acquisition component (i.e., [0]) in the interleave processing chain. The resulting coherent output waveform y[n] can be streamed directly into other post-processing operations, which are discussed above.

Figure 13B:
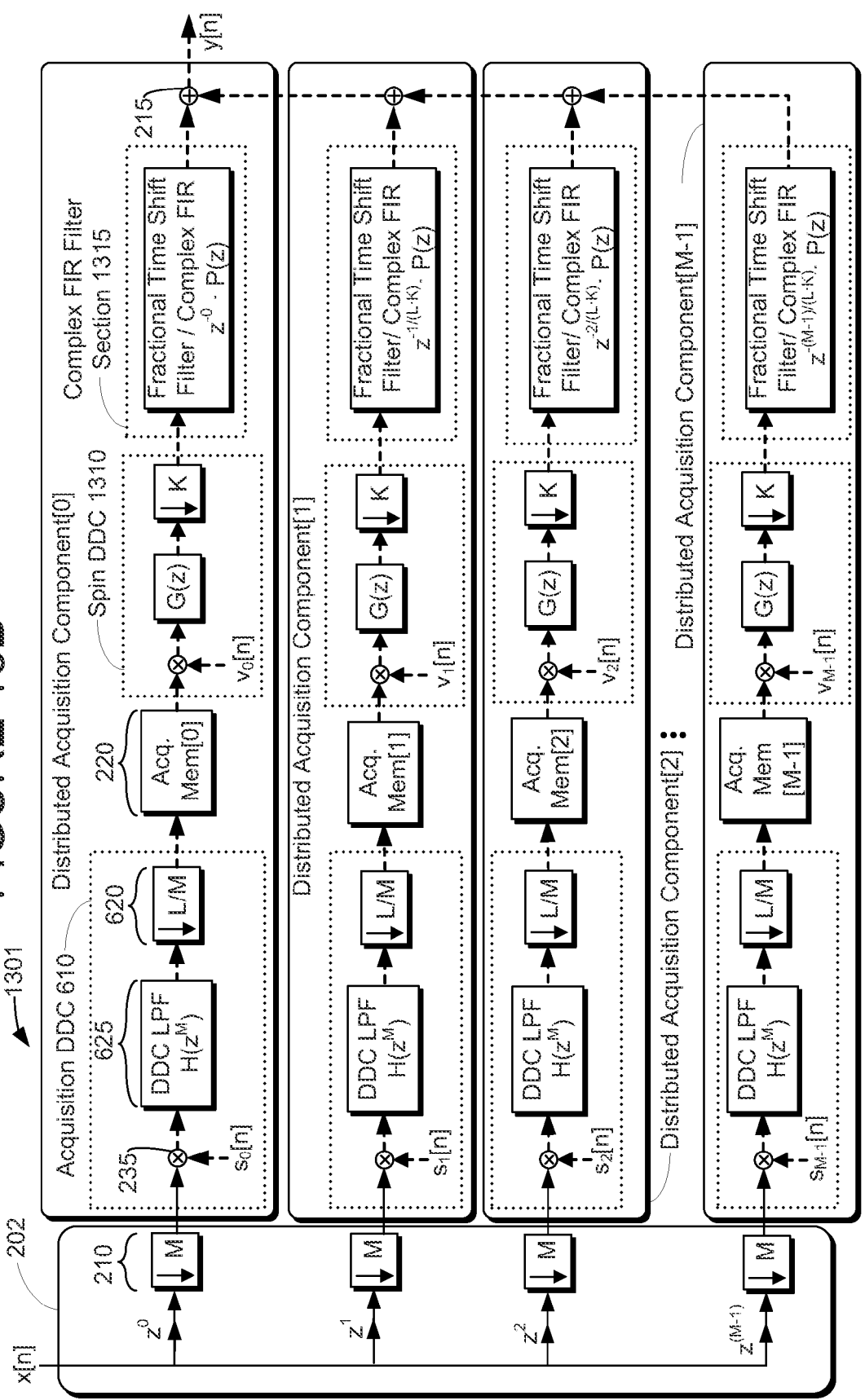
FIG. 13B illustrates a flow diagram including various components of a time-interleaved digital down-conversion system according to another example embodiment of the present invention, for cases where a secondary complex FIR filter stage is desired.

While FIG. 13A shows only acquisition DDC sections 610, it will be understood that the distributed complex FIR filter section 1315 approach can also be implemented where there are both acquisition DDC and secondary spin DDC sections, as described above with reference to FIG. 7. For example, FIG. 13B illustrates such an embodiment in which the spin DDC 1310 is disposed between the acquisition memory 220 and the complex FIR filter section 1315 in each of the distributed acquisition components.

Figure 14:
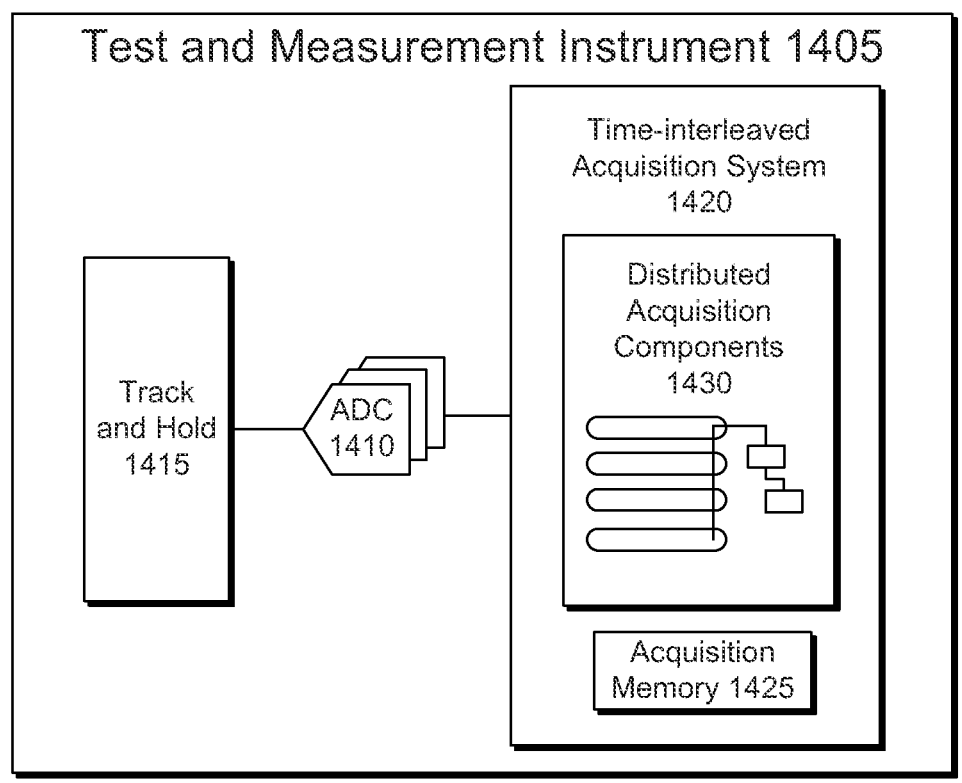
FIG. 14 illustrates a block diagram of a test and measurement instrument according to an example embodiment of the present invention.

FIG. 14 illustrates a block diagram of a test and measurement instrument 1405 according to an example embodiment of the present invention. The test and measurement instrument 1405 includes the time-interleaved acquisition system 1420, which can be the same or similar as one or more of the various embodiments (e.g., 200, 300, 400, 600, 700, 800, 900, 1000, 1100, 1200, 1300) as described and illustrated with reference to FIGS. 2-13 above.

The test and measurement instrument 1405 can include a high-bandwidth sampler such as a track and hold component 1415 to distribute digitized samples to the ADCs 1410. The test and measurement instrument 1405 also includes the acquisition memory 1425, which is also discussed in detail above. Furthermore, the time-interleaved acquisition system 1420 includes the distributed acquisition components 1430 (e.g., [0], [1], [2], ..., [M−1]) and associated components as also set forth in detail above. Each of the distributed acquisition components can be operationally coupled to at least one of the ADCs 1410 and configured to receive a time-interleaved portion of the digitized samples. The distributed acquisition components 1430 receive the digitized samples from the ADCs 1410 and perform various filtering, decimation, and de-interleaving operations, as described in detail above.

Although particular embodiments have been described, it will be appreciated that the principles of the invention are not limited to those embodiments. For example, alternate options for interleaved spectral operation can be used. Decimation-in-time FFT decomposition across multiple distributed acquisition components for large FFT sizes can be implemented to distribute the FFT computational load. In this approach, data is de-interleaved between the distributed acquisition components and then decimated/re-interleaved between all of the distributed acquisition components. In this second post-processing operation, data is sample-decimated in each of the distributed acquisition components with a different phase offset in every acquisition component. If the FFT is performed on the real interleaved data samples (e.g., no down-conversion required), then the above step can be skipped, as all of the distributed acquisition components will essentially have the data distributed correctly for the decimate-in-time approach.

In an M-way interleaved system, each distributed acquisition component can compute an N/M sized FFT in parallel, where N is the total FFT size. All of the intermediate FFT data can be shipped to the last acquisition component (i.e., [0]) in the interleave processing chain, which performs the last $\log_2(M)$ radix-2 FFT stages to combine the intermediate FFT results computed in parallel for each acquisition component. For instance, for an eight-way interleaved system, only 3 radix-2 FFT stages are needed in the last acquisition component (i.e., [0]) to stitch together the intermediate FFT results computed in parallel in each of the distributed acquisition components.

The final result of the FFT in the last acquisition component results in a coherent spectral waveform that can be streamed on to other downstream post-processing functions. The computational benefit obtained by parallelizing the FFT must be weighed against the extra time it takes to de-interleave and re-distribute the data in this scenario, but this approach has sizeable advantages at very large FFT sizes.

As another example embodiment, a segment-based batch FFT approach can be used. In this approach, data is distributed as entire acquisition record segments (contiguous in time) to different acquisition components in the interleave processing chain, which effectively processes many acquisition segments stored in memory simultaneously in parallel. For instance, eight acquisition segments can be processed in parallel for an 8-way interleaved system. In this case, data can be de-interleaved as described above across all distributed acquisition components, yielding a contiguous acquisition record in time. The resulting segment is then distributed to one of the distributed acquisition components over the inter-component interconnect for further processing of that segment. The next segment can be routed to a different distributed acquisition component, and so forth, to distribute the processing load of all segments across all of the available distributed acquisition components, and thus improving system performance.

There could be overlap between the acquisition records used in the FFTs in some scenarios, so some of the data can be sent to multiple acquisition components simultaneously to support overlapped acquisition segments. Once each acquisition component has a de-interleaved and coherent acquisition record available to process, then all acquisition components in the chain will process records in parallel. The results (e.g., measurements, waveform display images, statistics, etc.) can then be aggregated between all of the distributed acquisition components by various means to yield a composite result aggregated across all acquisition segments processed in this fashion.

Some embodiments can include one or more tangible computer-readable media storing computer-executable instructions that, when executed by a processor, operate to perform the methods described herein. Variations and modifications may be made without departing from the principles of the invention as set forth in the following claims. The functions described in this disclosure can be implemented by various means, including both software and hardware-based implementations, or any combination thereof.

What is claimed is:

1. A distributed acquisition apparatus, comprising:
   a sampler component configured to receive a signal under test;
   a plurality of analog-to-digital converters (ADCs) operationally coupled to the sampler component and configured to produce digitized samples of the signal under test;
   a time-interleaved acquisition processing network including a plurality of interconnected distributed acquisition components, each distributed acquisition component including:
      an acquisition memory configured to store a portion of the digitized samples; and
      a first summer configured to de-interleave the digitized samples between the distributed acquisition components; and a last distributed acquisition component associated with the interleaved processing network of distributed acquisition components, the last distributed acquisition component including an acquisition memory to store a portion of the digitized samples and a second summer configured to de-interleave the digitized samples, wherein the last distributed acquisition component is configured to receive the de-interleaved digitized samples from the plurality of distributed acquisition components and output a recombined coherent waveform.

2. The distributed acquisition apparatus of claim 1, further comprising:
a digital down-converter (DDC) section associated with the last distributed acquisition component, wherein the DDC section includes:
a mixer component configured to receive and multiply the recombined coherent waveform with a complex sinusoidal waveform, and to produce a mixed signal having mathematical real and imaginary parts;
a decimating filter coupled to the mixer component and configured to receive and filter the mixed signal; and
a down-sampler coupled to the decimating filter and configured to down-sample the mixed signal,
wherein the DDC section is configured to produce coherent down-converted complex in-phase and quadrature (I/Q) data.

3. The distributed acquisition apparatus of claim 2, wherein the digital down-converter section includes a plurality of down-samplers and a plurality of decimating filters, wherein the plurality of down-samplers are interspersed between the plurality of decimating filters.

4. The distributed acquisition apparatus of claim 2, wherein the DDC section is configured to receive the recombined coherent waveform from the second summer of the last distributed acquisition component.

5. The distributed acquisition apparatus of claim 1, wherein the acquisition memory of the distributed acquisition components is configured to store real data samples.

6. The distributed acquisition apparatus of claim 1, wherein each of the distributed acquisition components includes an up-sampler coupled to the acquisition memory, and configured to up-sample the digitized samples by a factor M, wherein M is the total number of distributed acquisition components including the last acquisition component.

7. The distributed acquisition apparatus of claim 1, wherein each of the distributed acquisition components includes:
a digital down-converter (DDC) section, wherein each DDC section includes:
a mixer component configured to receive and multiply the corresponding portion of the digitized samples with a complex sinusoidal waveform, and to produce a mixed signal having mathematical real and imaginary parts;
a decimating filter coupled to the mixer component and configured to receive and filter the mixed signal; and
a down-sampler coupled to the decimating filter and configured to down-sample the mixed signal,
wherein each DDC section is configured to produce down-converted complex in-phase and quadrature (I/Q) data.

8. The distributed acquisition apparatus of claim 7, wherein the digital down-converter section includes a plurality of down-samplers and a plurality of decimating filters, wherein the plurality of down-samplers are interspersed between the plurality of decimating filters.

9. The distributed acquisition apparatus of claim 7, wherein:
the first summer of each of the distributed acquisition components is coupled to an output of each corresponding DDC section, wherein the first summer is configured to de-interleave the down-converted data received from the DDC sections.

10. The distributed acquisition apparatus of claim 1, wherein each of the distributed acquisition components includes:
a mixer component coupled to an input of the corresponding acquisition memory, and configured to receive and multiply the corresponding portion of the digitized samples with a complex sinusoidal waveform, and to produce a mixed signal having mathematical real and imaginary parts;
a polyphase interpolation filter coupled to an output of the acquisition memory and configured to receive and filter the mixed signal; and
a down-sampler coupled to the corresponding polyphase interpolation filter and configured to down-sample the filtered signal.

11. The distributed acquisition apparatus of claim 10, wherein the polyphase interpolation filter includes a filter having the following frequency responses expressed as a z-transform:

$$H_m(z) = z^{\frac{m}{M}} \cdot H(z^M),$$
$$m \in [0:M-1]$$

where H(z) is the desired digital down-conversion filter response for a given bandwidth span and target sample rate, m is the relative polyphase phase selected from 0 to M−1 for a given parallel branch of the polyphase filter, and M is the total number of distributed acquisition components in the interleaved processing network of distributed acquisition components including the last acquisition component.

12. The distributed acquisition apparatus of claim 11, further comprising a delay stage to compensate for the relative sampling phase offsets between distributed acquisition components.

13. The distributed acquisition apparatus of claim 11, wherein the filter has the overall frequency response expressed as the z-transform for cases where L is greater than or equal to M, where L is the down-sample factor for a given bandwidth span and associated sample rate.

14. The distributed acquisition apparatus of claim 1, wherein each of the distributed acquisition components includes:
an acquisition DDC section coupled to an input of the acquisition memory, wherein each acquisition DDC section includes:
a mixer component configured to receive and multiply the corresponding portion of the digitized samples with a complex sinusoidal waveform, and to produce a mixed signal having mathematical real and imaginary parts;
a decimating filter coupled to the mixer component and configured to receive and filter the mixed signal; and
a down-sampler coupled to the decimating filter and configured to down-sample the mixed signal by a factor of L/M, wherein M is the total number of distributed acquisition components in the interleaved processing network of distributed acquisition components including the last acquisition component, and L is the down-sample factor for a given bandwidth span and associated sample rate; and a complex finite impulse response (FIR) filter section coupled to an output of the corresponding acquisition memory, wherein each complex FIR filter section includes a fractional time-shift filter.

15. The distributed acquisition apparatus of claim 14, wherein the digital down-converter section includes a plurality of down-samplers and a plurality of decimating filters, wherein the plurality of down-samplers are interspersed between the plurality of decimating filters.

16. The distributed acquisition apparatus of claim 14, further comprising a second complex FIR filter coupled to the second summer of the last distributed acquisition component, wherein the second complex FIR filter is configured to produce filtered complex I/Q data samples.

17. The distributed acquisition apparatus of claim 14, wherein the complex FIR filter section comprises a single complex FIR filter that combines a fractional time-shift and an arbitrary complex FIR filter in each section.

18. The distributed acquisition apparatus of claim 14, wherein each of the distributed acquisition components further includes a spin DDC section coupled to an output of the corresponding acquisition memory and to an input of the corresponding complex FIR filter section, wherein the acquisition DDC section is configured to operate in real-time prior to storing acquisition data to the corresponding acquisition memory, and wherein the spin DDC section is configured to process information received from the acquisition memory.

19. The distributed acquisition apparatus of claim 1, further comprising:
a spin DDC section coupled to the second summer of the last distributed acquisition component; and
a frequency transform section coupled to the spin DDC section, wherein the frequency transform section is configured to produce complex spectral samples in the frequency domain.

20. The distributed acquisition apparatus of claim 1, further comprising:
an acquisition buffer coupled to the second summer of the last distributed acquisition component; and
a frequency transform section coupled to the acquisition buffer, wherein the frequency transform is configured to produce complex spectral samples in the frequency domain.

21. The distributed acquisition apparatus of claim 1, wherein each of the distributed acquisition components includes:
an acquisition DDC section coupled to an input of the acquisition memory, wherein the acquisition DDC section includes:
a mixer component configured to receive and multiply the corresponding portion of the digitized samples with a complex sinusoidal waveform, and to produce a mixed signal having mathematical real and imaginary parts;
a decimating filter coupled to the mixer component and configured to receive and filter the mixed signal;
a down-converter coupled to the one or more decimating filters and configured to down-sample the mixed signal by a factor of L/M, wherein M is the total number of distributed acquisition components in the interleaved processing network of distributed acquisition components including the last acquisition component, and L is the down-sample factor for a given bandwidth span and associated sample rate; and
a frequency transform section coupled to an output of the corresponding acquisition memory, wherein each frequency transform section is configured to produce complex spectral samples in the frequency domain.

22. The distributed acquisition apparatus of claim 21, wherein the digital down-converter section includes a plurality of down-samplers and a plurality of decimating filters, wherein the plurality of down-samplers are interspersed between the plurality of decimating filters.

23. The distributed acquisition apparatus of claim 21, wherein:
the first summer of each of the distributed acquisition components is coupled to an output of each corresponding frequency transform section, wherein the first summer is configured to de-interleave the complex spectral samples received from the frequency transform sections.

24. The distributed acquisition apparatus of claim 21, further comprising:
a spin DDC section coupled to an output of the acquisition memory and to an input of the frequency transform section.

25. The distributed acquisition apparatus of claim 1, further comprising:
a spin DDC section coupled to the second summer of the last distributed acquisition component; and
a complex FIR filter section coupled to the spin DDC section, wherein the complex FIR filter section includes a complex finite impulse response (FIR) filter to produce filtered complex I/Q data samples.

* * * * *